(12) United States Patent
Caveney et al.

(10) Patent No.: US 8,011,972 B2
(45) Date of Patent: Sep. 6, 2011

(54) CONNECTOR WITH CROSSTALK COMPENSATION

(75) Inventors: Jack E. Caveney, Hinsdale, IL (US); Masud Bolouri-Saransar, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 11/674,359

(22) Filed: Feb. 13, 2007

(65) Prior Publication Data

US 2007/0190863 A1 Aug. 16, 2007

Related U.S. Application Data

(60) Provisional application No. 60/772,802, filed on Feb. 13, 2006.

(51) Int. Cl.
*H01R 24/00* (2006.01)

(52) U.S. Cl. ........................................ 439/676; 439/941

(58) Field of Classification Search .................. 439/676, 439/941, 67, 77
See application file for complete search history.

(56) References Cited

U.S. PATENT DOCUMENTS

| | | |
|---|---|---|
| 3,565,807 A | 2/1971 | Siverisen et al. |
| 4,153,325 A | 5/1979 | Asick |
| 4,392,701 A | 7/1983 | Weidler |
| 4,409,608 A | 10/1983 | Yoder |
| 4,651,340 A | 3/1987 | Marson |
| 4,731,833 A | 3/1988 | Gumb et al. |
| 4,756,695 A | 7/1988 | Lane et al. |
| 4,767,338 A | 8/1988 | Dennis et al. |
| 4,968,260 A | 11/1990 | Ingalsbe |
| 4,975,078 A | 12/1990 | Stroede et al. |
| 5,006,822 A | 4/1991 | Reddy |
| 5,055,966 A | 10/1991 | Smith et al. |
| 5,069,641 A | 12/1991 | Sakamoto et al. |
| 5,089,923 A | 2/1992 | Lehureau |
| 5,091,826 A | 2/1992 | Arnett et al. |
| 5,163,836 A | 11/1992 | Young et al. |
| 5,178,554 A | 1/1993 | Siemon et al. |
| 5,186,647 A | 2/1993 | Denkmann et al. |
| 5,228,872 A | 7/1993 | Liu |
| 5,269,708 A | 12/1993 | DeYoung et al. |
| 5,295,869 A | 3/1994 | Siemon et al. |
| 5,299,956 A | 4/1994 | Brownell et al. |
| 5,310,363 A * | 5/1994 | Brownell et al. ............. 439/676 |
| 5,326,284 A | 7/1994 | Bohbot et al. |
| 5,399,106 A | 3/1995 | Ferry |
| 5,414,393 A * | 5/1995 | Rose et al. ........................ 333/1 |
| 5,431,584 A | 7/1995 | Ferry |

(Continued)

FOREIGN PATENT DOCUMENTS

EP 0598192 5/1994

(Continued)

*Primary Examiner* — Tulsidas C. Patel
*Assistant Examiner* — Vladimir Imas
(74) *Attorney, Agent, or Firm* — Robert A. McCann; Christopher S. Clancy; Christopher K. Marlow

(57) ABSTRACT

A jack with a flexible printed circuit board (FPC) is provided. The FPC is connected to the plug interface contacts and has a compensation circuit to compensate for near-end crosstalk (NEXT) and far-end crosstalk (FEXT). Capacitive and inductive compensation in the compensation circuit are of opposite polarity and are substantially equal in magnitude. The compensation circuit has a FEXT compensation zone containing compensation for the FEXT. Inductive and capacitive compensation in the FEXT compensation zone are distributed.

17 Claims, 30 Drawing Sheets

U.S. PATENT DOCUMENTS

| | | | | |
|---|---|---|---|---|
| 5,432,484 | A | 7/1995 | Klas et al. | |
| 5,435,752 | A | 7/1995 | Siemon et al. | |
| 5,454,738 | A | 10/1995 | Lim et al. | |
| 5,470,244 | A | 11/1995 | Lim et al. | |
| 5,488,201 | A | 1/1996 | Liu | |
| 5,503,572 | A | 4/1996 | White et al. | |
| 5,513,065 | A | 4/1996 | Caveney et al. | |
| 5,577,937 | A | 11/1996 | Itoh et al. | |
| 5,586,914 | A | 12/1996 | Foster, Jr. et al. | |
| 5,618,185 | A | 4/1997 | Aekins | |
| 5,636,099 | A | 6/1997 | Sugawara et al. | |
| 5,663,870 | A | 9/1997 | Kerndlmaier | |
| 5,679,027 | A | 10/1997 | Smith | |
| 5,700,167 | A * | 12/1997 | Pharney et al. | 439/676 |
| 5,716,237 | A | 2/1998 | Conorich et al. | |
| 5,766,034 | A | 6/1998 | Block et al. | |
| 5,769,647 | A * | 6/1998 | Tulley et al. | 439/144 |
| 5,779,503 | A | 7/1998 | Tremblay et al. | |
| 5,791,943 | A * | 8/1998 | Lo et al. | 439/676 |
| 5,797,764 | A | 8/1998 | Coulombe et al. | |
| 5,885,111 | A | 3/1999 | Yu | |
| 5,915,989 | A | 6/1999 | Adriaenssens et al. | |
| 5,930,119 | A | 7/1999 | Berding | |
| 5,971,812 | A | 10/1999 | Martin | |
| 5,997,358 | A * | 12/1999 | Adriaenssens et al. | 439/676 |
| 6,017,229 | A * | 1/2000 | Tulley et al. | 439/144 |
| 6,017,247 | A | 1/2000 | Gwiazdowski | |
| 6,057,743 | A | 5/2000 | Aekins | |
| 6,079,996 | A | 6/2000 | Arnett | |
| 6,089,923 | A * | 7/2000 | Phommachanh | 439/676 |
| 6,096,980 | A | 8/2000 | Ferry | |
| 6,102,741 | A | 8/2000 | Boutros et al. | |
| 6,120,330 | A | 9/2000 | Gwiazdowski | |
| 6,155,881 | A | 12/2000 | Arnett et al. | |
| 6,168,474 | B1 | 1/2001 | German et al. | |
| 6,176,742 | B1 | 1/2001 | Arnett et al. | |
| 6,183,306 | B1 | 2/2001 | Caveney | |
| 6,196,880 | B1 | 3/2001 | Goodrich et al. | |
| 6,231,397 | B1 | 5/2001 | de la Borbolla et al. | |
| 6,238,235 | B1 | 5/2001 | Shavit et al. | |
| 6,250,968 | B1 | 6/2001 | Winings | |
| 6,255,593 | B1 | 7/2001 | Reede | |
| 6,267,617 | B1 | 7/2001 | Nozick | |
| 6,305,950 | B1 | 10/2001 | Doorhy | |
| 6,319,069 | B1 | 11/2001 | Gwiazdowski | |
| 6,332,810 | B1 | 12/2001 | Bareel | |
| 6,333,472 | B1 | 12/2001 | Weatherley | |
| 6,338,655 | B1 | 1/2002 | Masse et al. | |
| 6,356,162 | B1 | 3/2002 | DeFlandre et al. | |
| 6,371,793 | B1 | 4/2002 | Doorhy et al. | |
| 6,379,157 | B1 * | 4/2002 | Curry et al. | 439/676 |
| 6,379,175 | B1 | 4/2002 | Reede | |
| 6,402,560 | B1 | 6/2002 | Lin | |
| 6,409,547 | B1 * | 6/2002 | Reede | 439/676 |
| 6,410,845 | B2 | 6/2002 | Reede | |
| 6,464,529 | B1 * | 10/2002 | Jensen et al. | 439/405 |
| 6,464,541 | B1 * | 10/2002 | Hashim et al. | 439/676 |
| 6,483,714 | B1 | 11/2002 | Kabumoto et al. | |
| 6,520,808 | B2 * | 2/2003 | Forbes et al. | 439/676 |
| 6,524,139 | B1 | 2/2003 | Chang | |
| 6,533,618 | B1 * | 3/2003 | Aekins | 439/676 |
| 6,554,638 | B1 | 4/2003 | Hess et al. | |
| 6,641,443 | B1 | 11/2003 | Itano et al. | |
| 6,736,681 | B2 | 5/2004 | Arnett | |
| 6,769,937 | B1 | 8/2004 | Roberts | |
| 6,780,035 | B2 | 8/2004 | Bohbot | |
| 6,796,847 | B2 | 9/2004 | AbuGhazaleh et al. | |
| 6,802,743 | B2 * | 10/2004 | Aekins et al. | 439/676 |
| 6,916,209 | B1 * | 7/2005 | Casher et al. | 439/676 |
| 7,154,049 | B2 | 12/2006 | Celella et al. | |
| 2001/0014563 | A1 | 8/2001 | Morita et al. | |
| 2002/0019172 | A1 * | 2/2002 | Forbes et al. | 439/676 |
| 2002/0197043 | A1 | 12/2002 | Hwang | |
| 2003/0171024 | A1 | 9/2003 | Mossner et al. | |
| 2003/0194908 | A1 | 10/2003 | Brown et al. | |
| 2004/0184247 | A1 | 9/2004 | Adriaenssens et al. | |
| 2004/0248468 | A1 | 12/2004 | Gurovich et al. | |
| 2005/0014420 | A1 | 1/2005 | Quenneville et al. | |
| 2005/0136747 | A1 | 6/2005 | Caveney et al. | |
| 2005/0181676 | A1 * | 8/2005 | Caveney et al. | 439/676 |
| 2005/0202697 | A1 * | 9/2005 | Caveney et al. | 439/77 |
| 2005/0207561 | A1 * | 9/2005 | Hammond, Jr. | 379/351 |
| 2005/0208838 | A1 | 9/2005 | Horowitz et al. | |
| 2005/0239338 | A1 * | 10/2005 | Hashim | 439/676 |
| 2005/0277339 | A1 * | 12/2005 | Caveney et al. | 439/676 |
| 2006/0014410 | A1 * | 1/2006 | Caveney | 439/188 |
| 2006/0121791 | A1 * | 6/2006 | Hashim | 439/676 |

FOREIGN PATENT DOCUMENTS

| | | |
|---|---|---|
| EP | 0901201 | 3/1999 |
| EP | 1063734 | 12/2000 |
| EP | 1191646 | 3/2002 |
| EP | 1275177 | 2/2004 |
| FR | 2823606 | 10/2002 |
| GB | 2380334 | 4/2003 |
| WO | 9930388 | 6/1999 |
| WO | 9945611 | 9/1999 |
| WO | 0180376 | 10/2001 |
| WO | 0217442 | 2/2002 |
| WO | 2004001906 | 12/2003 |
| WO | 2004086828 | 10/2004 |
| WO | 2005101579 | 10/2005 |

* cited by examiner

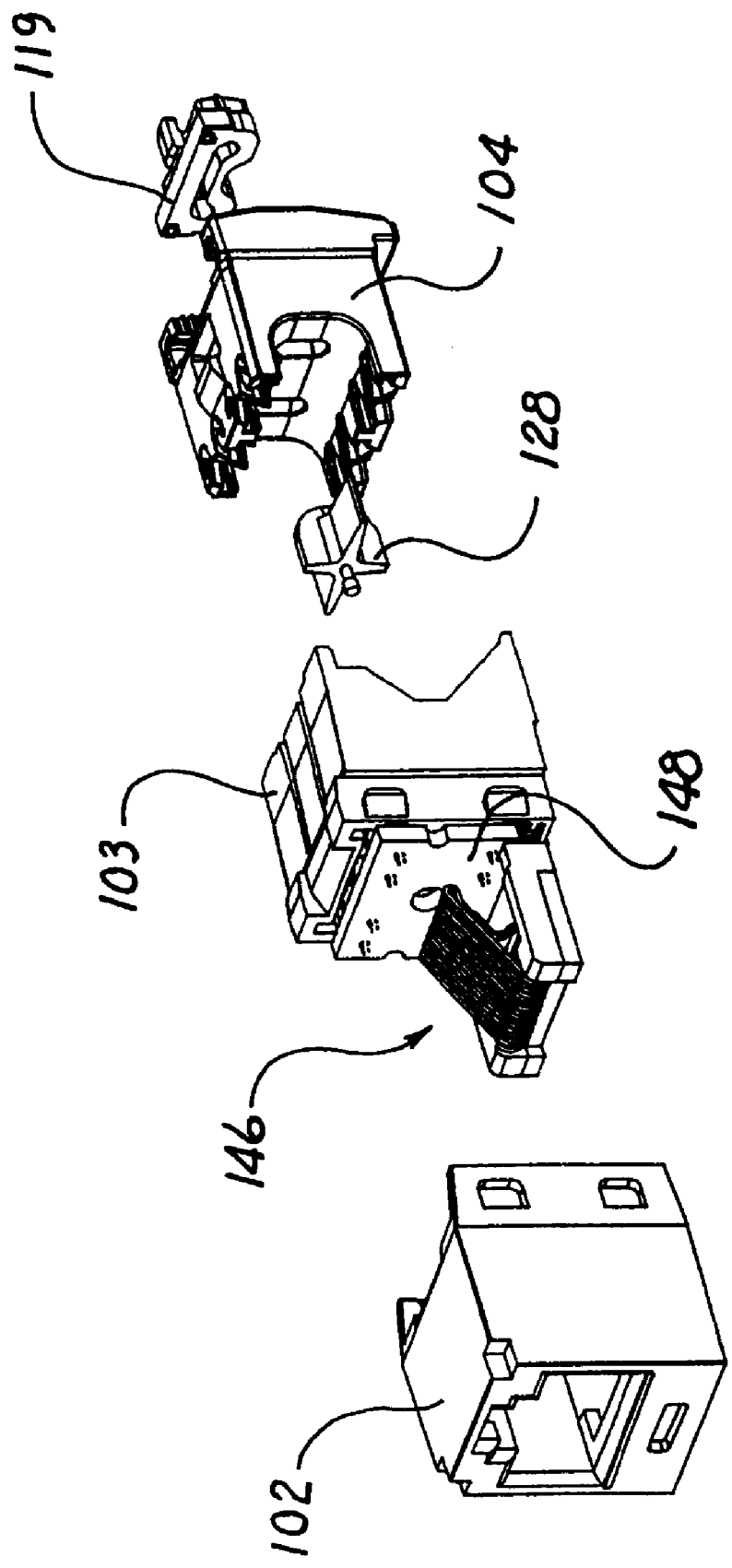

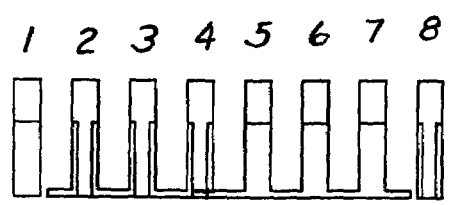
Fig. 18a
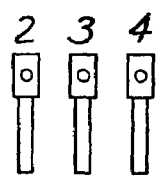   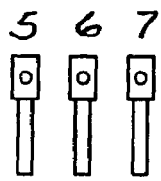
Fig. 18b                    Fig. 18c

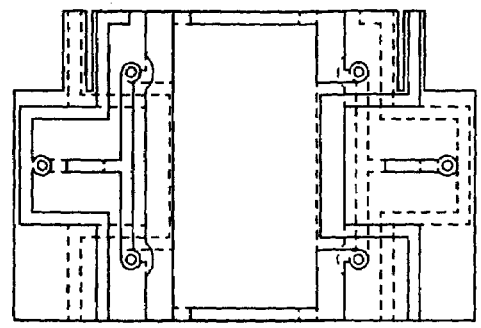
Fig. 18d
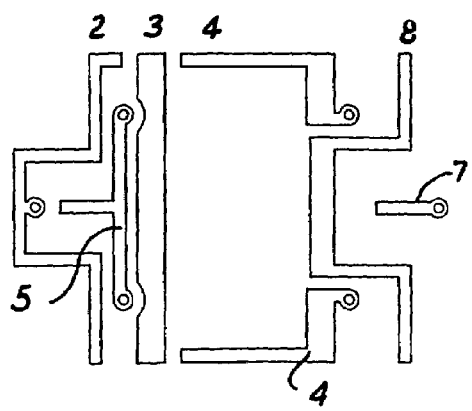 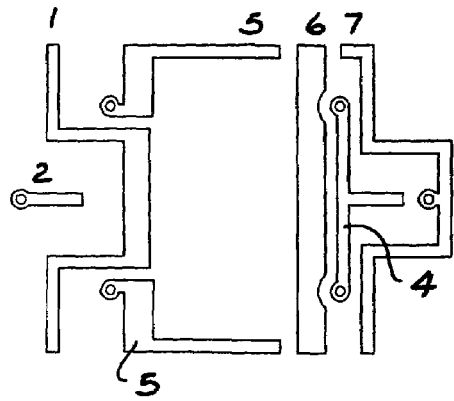
Fig. 18e          Fig. 18f

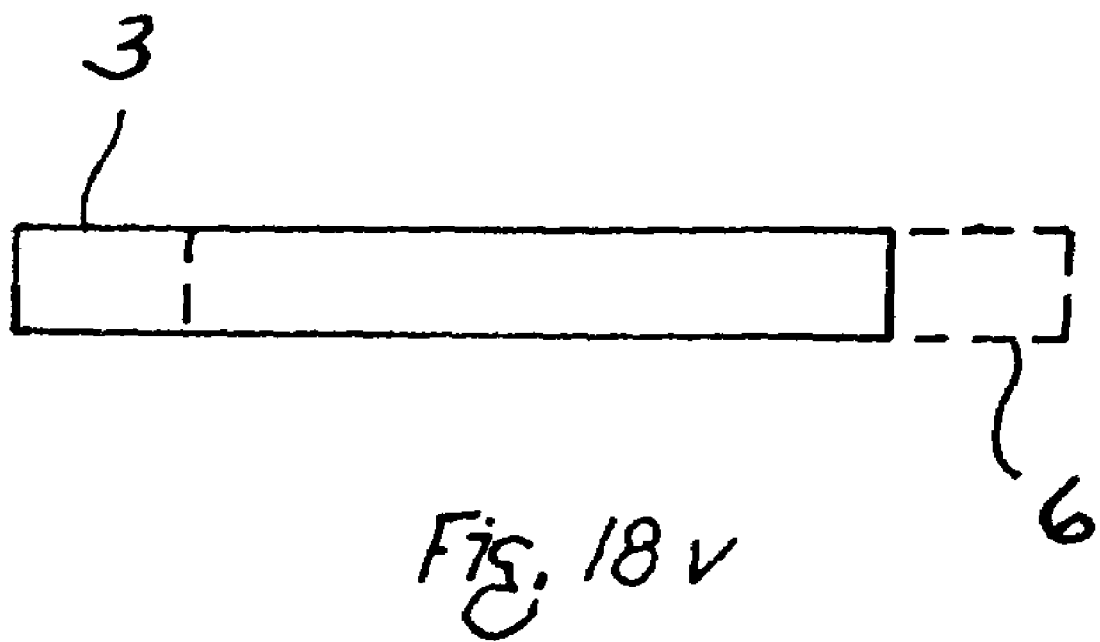

CONNECTOR WITH CROSSTALK COMPENSATION

CROSS-REFERENCE TO RELATED APPLICATIONS

This application claims priority to U.S. Provisional Patent Application No. 60/772,802 filed Feb. 13, 2006, entitled "Connector with Crosstalk Compensation."

This application further incorporates by reference in their entireties the following U.S. patent applications:
   a) Ser. No. 11/195,412, entitled "Wire Containment Cap," filed Aug. 2, 2005;
   b) Ser. No. 11/305,476, entitled "Wire Containment Cap with an Integral Strain Relief Clip," filed Dec. 16, 2005;
   c) Ser. No. 11/462,204, entitled "Wire Containment Cap," filed Aug. 2, 2006; and
   d) Ser. No. 11/099,110, entitled "Electrical Connector with Improved Crosstalk Compensation," filed Apr. 5, 2005, now U.S. Pat. No. 7,153,168.

FIELD OF THE INVENTION

The present invention relates generally to electrical connectors, and more particularly, to a modular communication jack design with an improved wire containment cap and pair divider and crosstalk compensation.

BACKGROUND OF THE INVENTION

In the communications industry, as data transmission rates have steadily increased, crosstalk due to capacitive and inductive couplings among the closely spaced parallel conductors within the jack and/or plug has become increasingly problematic. Modular connectors with improved crosstalk performance have been designed to meet the increasingly demanding standards. Many of these connectors have addressed crosstalk by compensating at the front end of the jack, i.e., the end closest to where a plug is inserted into the jack. However, the wire pairs terminated to the insulation displacement contact ("IDC") terminals at the rear portion of a jack may also affect the performance of the jack.

One problem that exists when terminating wire pairs to the IDC terminals of a jack is the effect that termination has on the crosstalk performance of a jack. When a twisted-pair cable with four wire pairs is aligned and terminated to the IDC terminals of a jack, a wire pair may need to flip over or under another wire pair. An individual conductor of a wire pair may also be untwisted and oriented closely to a conductor from a different wire pair. Both of these conditions may result in unintended coupling in the termination area which can degrade the crosstalk performance of the jack. Thus, a solution addressing the crosstalk in the termination area of the jack would be desirable.

A second problem that exists when terminating wire pairs to the IDC terminals of a jack is variability. A technician is typically called on to properly terminate the wire pairs of a twisted pair cable to the proper IDC terminals of the jack. Each jack terminated by the technician should have similar crosstalk performance. This requires the termination to remain consistent from jack to jack. However, different installers may use slightly different techniques to separate the wire pairs and route them to their proper IDC terminals. Thus, a solution that controls the variability of terminations from jack to jack would be desirable.

A final issue that arises when terminating wire pairs to the IDC terminals of a jack is the difficulty of the termination process. Typical jacks provide little assistance to the technician, resulting in occasional misterminations (e.g., a wire being terminated at an incorrect location in the jack). Even if detailed instructions are provided with the jack, technicians may not read these instructions prior to installing the jacks. Furthermore, a jack with a difficult termination process can increase the installation time for the technician and result in a costly installation for the customer. Thus, a jack solution that simplifies the termination process and minimizes the possibility of technician error would be desirable.

It is further desirable to combine these benefits with an improved pair divider within the connector, along with crosstalk compensation, to improve overall jack performance.

SUMMARY

The present application meets the shortcomings of the prior art by providing a wire containment cap having a first side including a plurality of wire slots with retainers for retaining wires, a second side being opposite the first side, sidewalls extending between the first side and the second side, and twisted pair holes or slots with funnel-shaped entrances between the first side and the second side.

A communication jack assembly is also described. The communication jack comprises a front portion including a retention clip, and the wire containment cap including a retention recess for securing the wire containment cap to the front portion.

Wire containment caps and communication jack assemblies according to the present invention may be provided in shielded or unshielded embodiments. Further, the second side of wire containment caps according to the present invention may be provided with a slot and other features allowing for the use of an integral strain relief clip. A metal pair divider may also be incorporated in order to provide an electrical shield between wire pairs in the communication jack.

Crosstalk compensation techniques are used to improve the communication performance of connectors in some embodiments of the present invention.

BRIEF DESCRIPTION OF THE FIGURES

FIG. 11 is a partial exploded view of a communication jack;

DETAILED DESCRIPTION OF THE PREFERRED EMBODIMENTS

Figure 1:
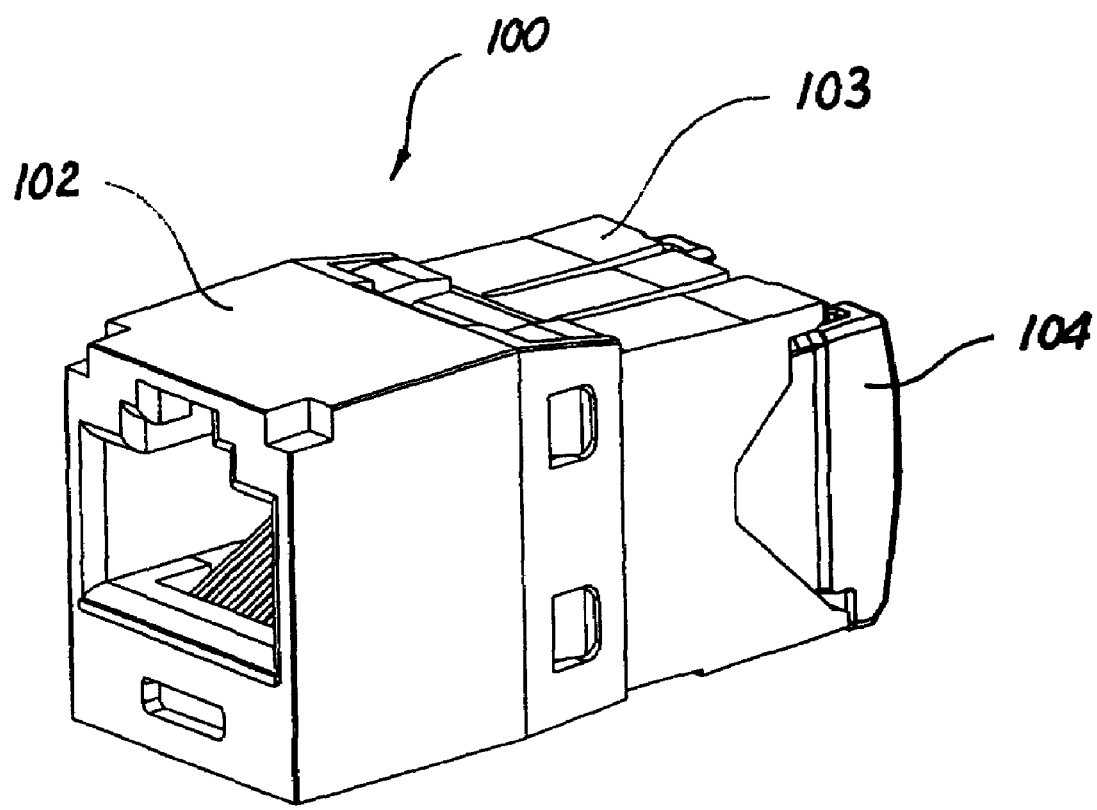
FIG. 1 is a front upper right perspective view of a communication jack having a wire containment cap in accordance with an embodiment of the present invention.

FIG. 1 is a front upper right perspective view of a communication jack 100 according to one embodiment of the present invention. The communication jack 100 includes a front jack housing 102, a rear jack housing 103, and a wire containment cap 104. The front jack housing 102 and rear jack housing 103 may house such components as plug interface contacts, a mechanism for coupling the jack to a plug, crosstalk compensation circuitry, and IDCs (insulation-displacement contacts) to provide an electrical connection between the jack and a four-twisted-pair communication cable.

Figure 2:
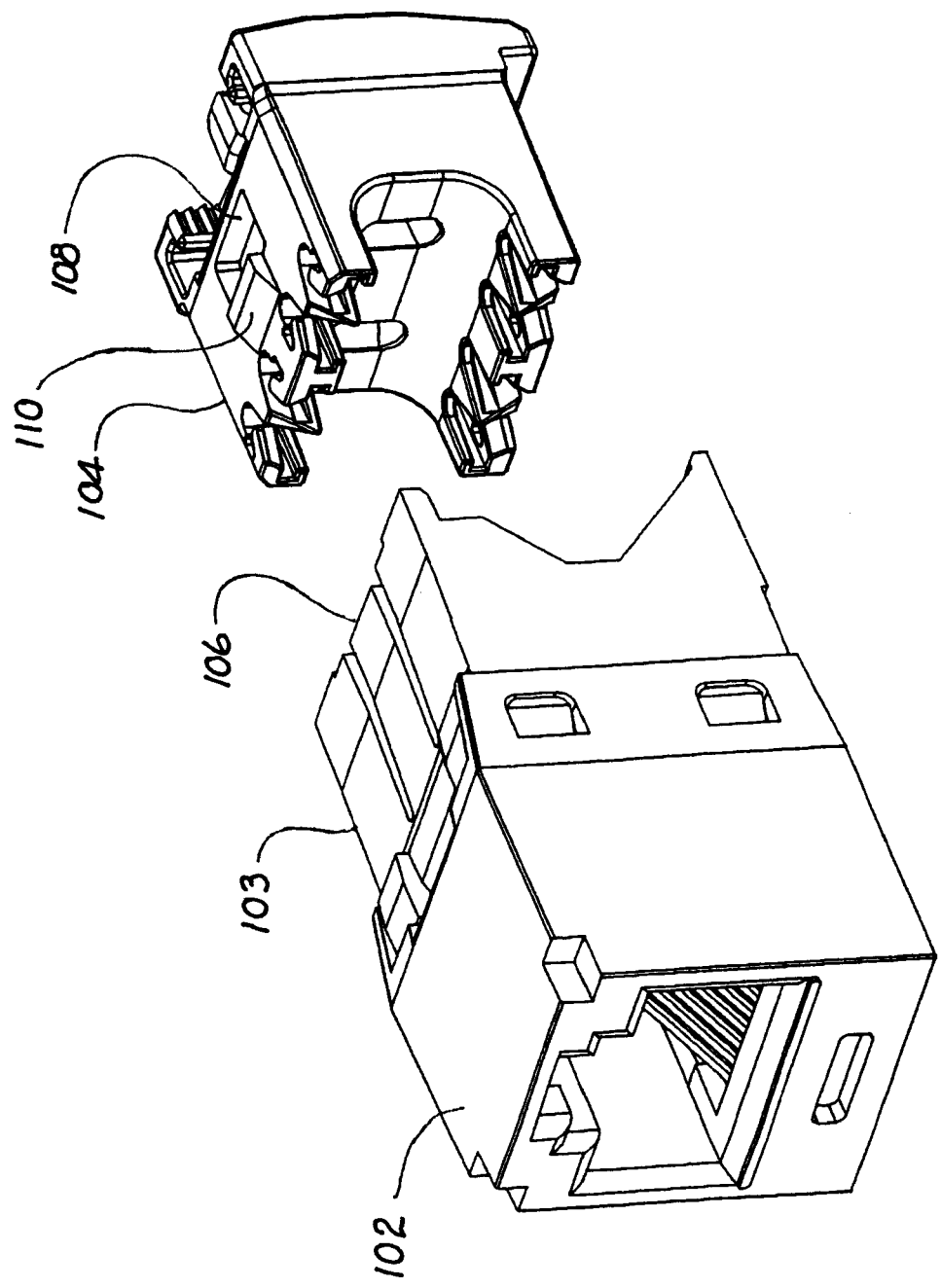
FIG. 2 is a front upper right partially exploded view of the communication jack of FIG. 1.

FIG. 2 is a front upper right partial-exploded view of the communication jack 100 of FIG. 1. In the embodiment shown, the wire containment cap 104 is slidably mounted within the rear jack housing 103. A retention clip 106 on the rear jack housing 103 and a retention recess 108 on the wire containment cap 104 may be included to secure the wire containment cap 104 to the rear jack housing 103. A retention latch 110 is also provided in the embodiment of FIG. 2. Other mounting and securing techniques may also be used.

Figure 3:
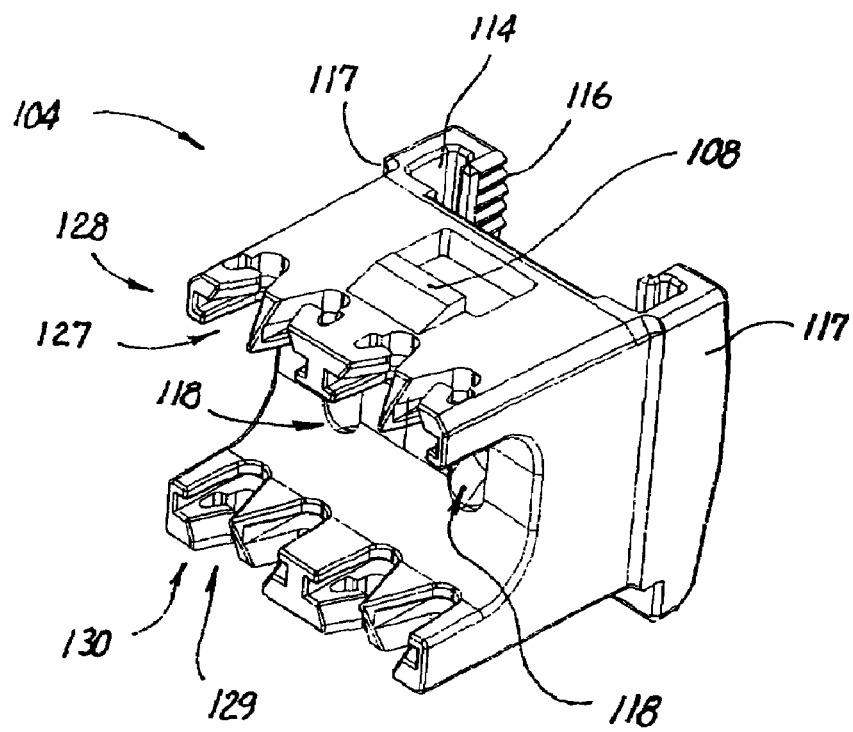
FIG. 3 is a front upper right perspective view of a wire containment cap in accordance with an embodiment of the present invention.
Figure 4:
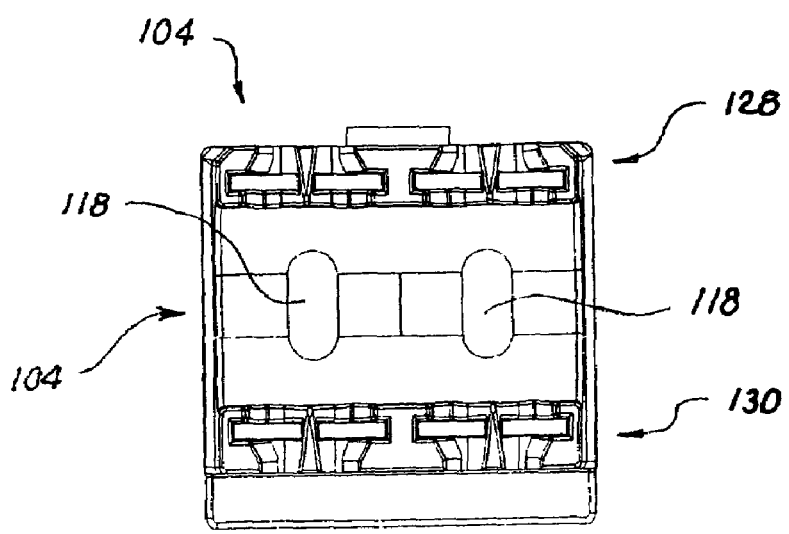
FIG. 4 is a front view of the wire containment cap of FIG. 3.
Figure 5:
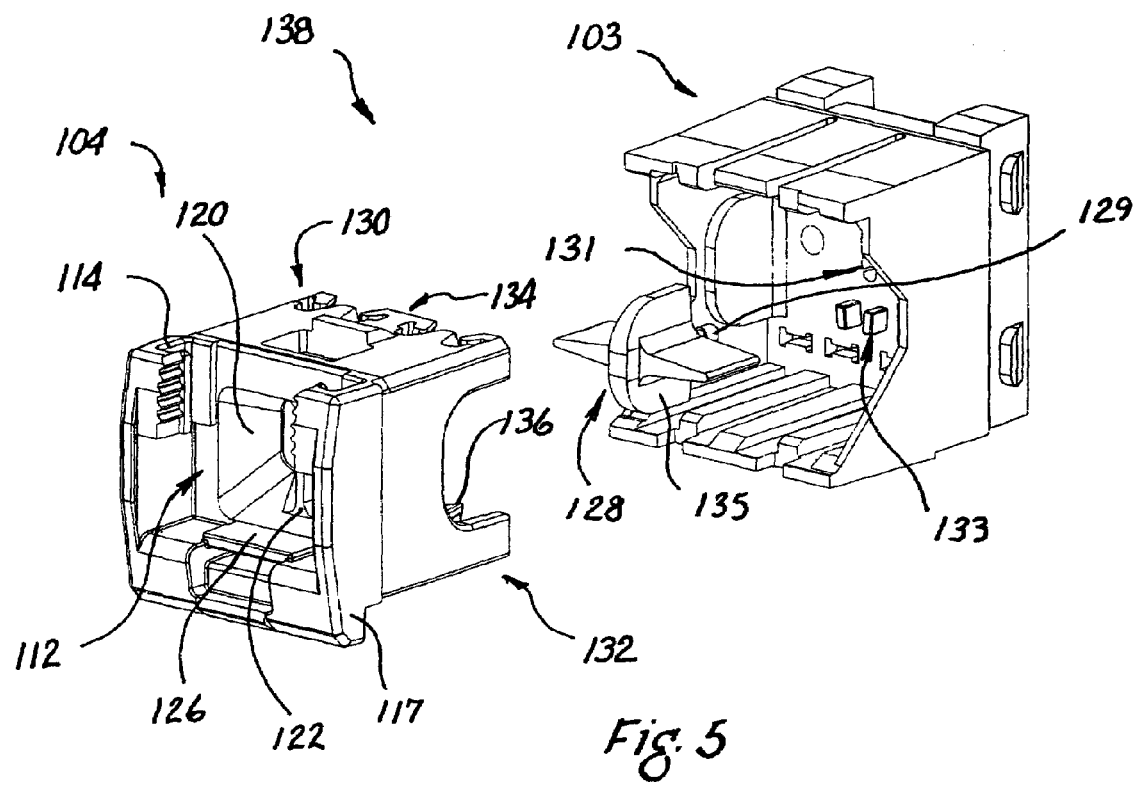
FIG. 5 is a rear upper left exploded view of a wire routing assembly comprising a wire containment cap, a metal pair divider, and a rear jack housing according to one embodiment of the present invention.
Figures 6, 7:
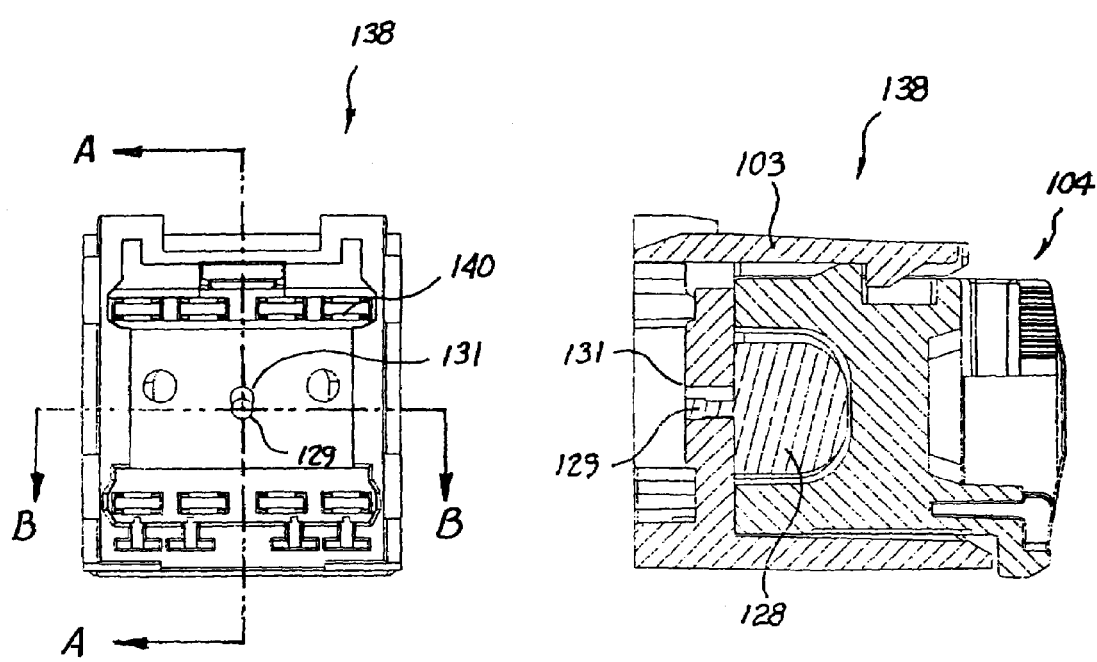
FIG. 6 is a front view of the wire routing assembly of FIG. 5.
FIG. 7 is a cross-sectional view of the wire routing assembly of FIG. 6, taken along the line A-A.
Figure 8:
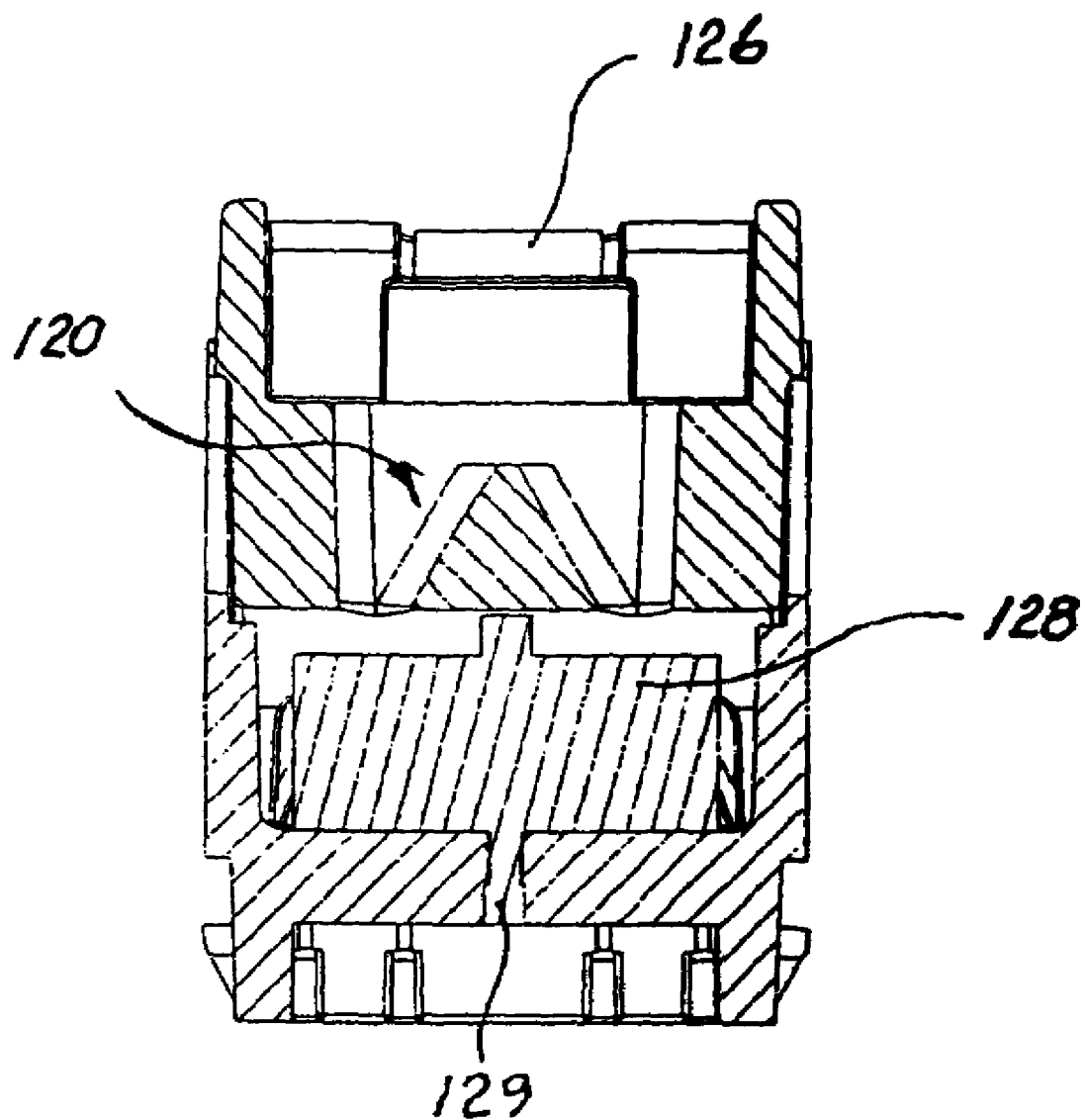
FIG. 8 is a cross-sectional view of the wire routing assembly of FIG. 6, taken along the line B-B.

FIGS. 3-5 illustrate the wire containment cap 104 in further detail. The wire containment cap 104 includes a large opening 112 in the back (shown in FIG. 5) to allow a cable to be inserted and to allow twisted pairs to separate in a short distance as they transition toward IDC terminals. The back of the wire containment cap 104 also has a strain relief guide slot 114 and strain relief latch teeth 116 to accommodate a strain relief clip as shown and described in U.S. provisional patent application Ser. No. 60/636,972, filed on Dec. 17, 2004 and entitled "Wire Containment Cap with an Integral Strain Relief Clip." One embodiment of a strain relief 119 clip is shown in FIG. 11. Shoulders 117 are provided on the left and right along the rear of the wire containment cap 104.

The opening 112 provides easy access to two twisted-pair slots 118 having funnel-shaped slot entrances 120. A rear spine 122 separates the twisted-pair slots 118 toward the rear of the wire containment cap 104. A saddle area 126 serves as a lower support for a cable when the cable is secured by the strain relief clip.

In a preferred embodiment of the present invention, twisted wire pairs are separated and crossed over as necessary toward the rear of the wire containment cap 104, before two twisted pairs enter each of the slots 118. The saddle area 126 is sufficiently low and the rear spine 122 is sufficiently offset from the rear end of the wire containment cap 104 to provide ample space to cross over twisted pairs as necessary on the rear sides of the slots 118. One reason a crossover may be necessary is because the twisted pair layout on one end of a twisted pair cable is a mirror image of the wire pair layout on the opposite end of the twisted pair cable. Another reason this crossover may be necessary is because the Telecommunications Industry Association ("TIA") standards allow structured cabling systems to be wired using two different wiring schemes. Finally, a crossover may occur because not all cables have the same pair layout.

The communication jack 100 also incorporates a pair divider 128. The pair divider 128 is preferably made of metal and provides an electrical shield between wire pairs in the area near the end of an installed cable. This portion of the cable typically lacks proper twist of the wires of each pair and/or lacks proper shielding of each pair. The metal pair divider therefore decreases crosstalk magnitude and variation. According to one embodiment, the pair divider 128 is made of a vacuum-metallized plastic.

In the embodiment of FIGS. 5-8, the pair divider 128 has a mounting projection 129 that is inserted into a mounting hole 131 in the rear jack housing 103. After the mounting projection 129 is inserted into the mounting hole 131, the pair divider 128 is lowered slightly so that fin restraints 133 provided on the rear jack housing 103 engage a lower fin 135 of the pair divider 128. This prevents rotation of the pair divider 128.

Figure 12:
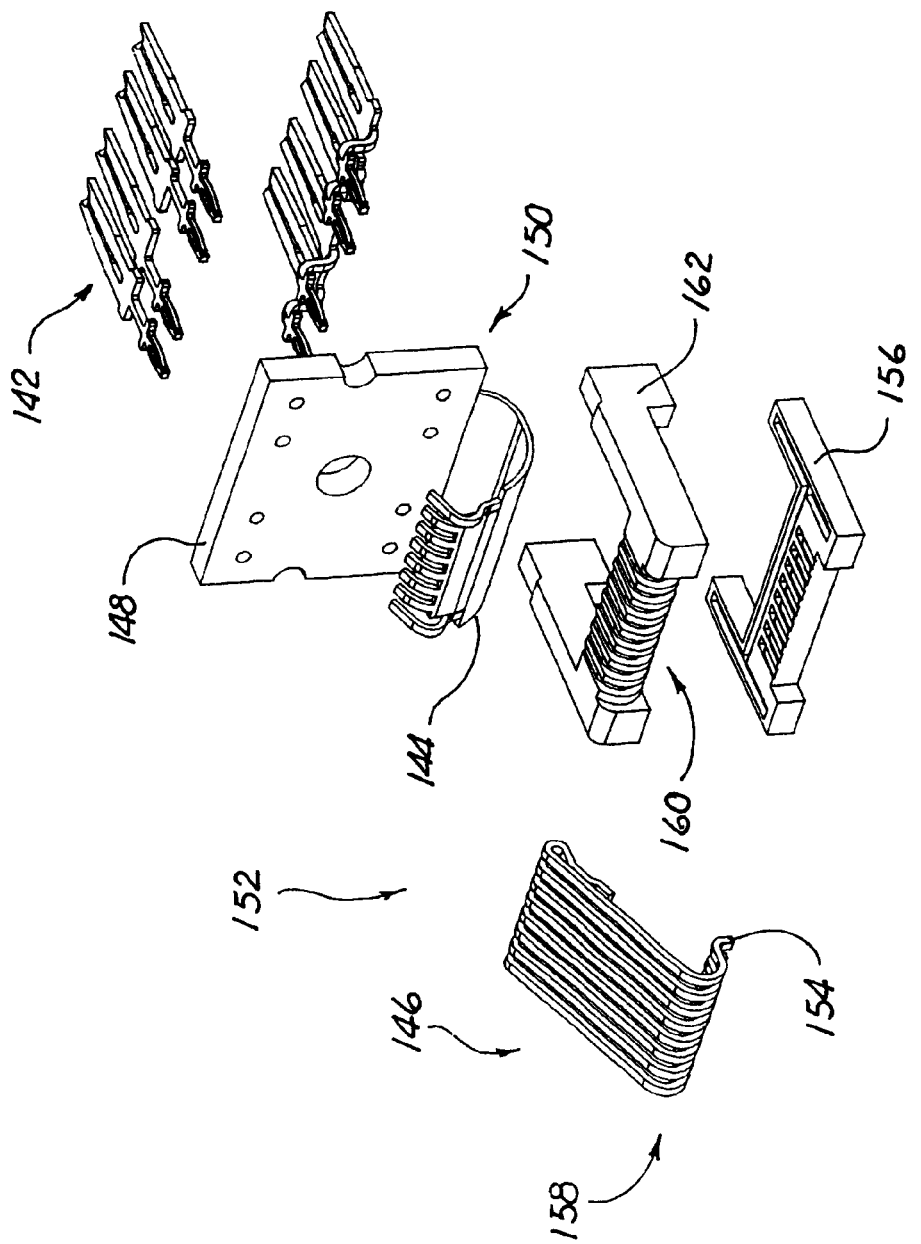
FIG. 12 is an exploded view of a plug interface contact assembly and a compensation circuitry assembly.

To complete the installation of wires in the communication jack 100, the technician need only place twisted pairs through appropriate slots 118, secure individual wires in the upper and lower wire retainers 130 and 132 having upper and lower wire restraints 134 and 136 (as shown in FIG. 3), cut off the excess wire ends, and attach the wire containment cap 104 to the rear jack housing 103 of the communication jack 100 to complete construction of the wire routing assembly 138. IDC slots 140 within the rear jack housing 103 allow IDCs 142 (as shown in FIG. 12) to pass through and contact the wires.

Figure 10:
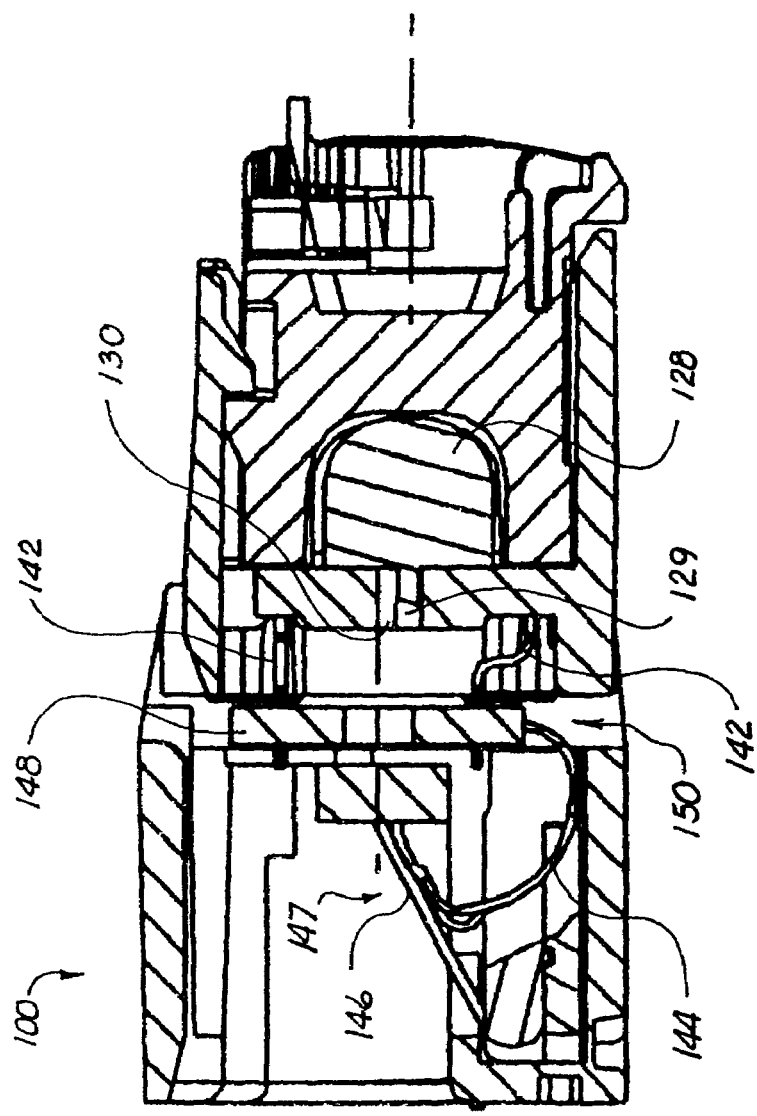
FIG. 10 is a cross-sectional view of the jack of FIG. 9, taken along the line C-C.
Figure 9:
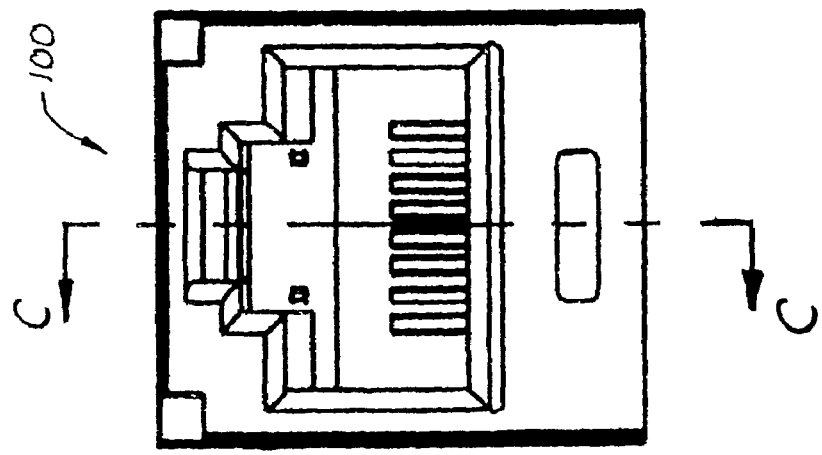
FIG. 9 is a front view of a communication jack according to one embodiment of the present invention.

FIG. 9 is a front view of the communication jack 100, and FIG. 10 is a cross-sectional view of the communication jack 100 along the line C-C of FIG. 9. A flexible printed circuit (FPC) 144 makes electrical contact with plug interface contacts 146 directly below the plug-jack interface 147, where the contacts of a plug mate with the plug interface contacts 146. In the embodiment of FIG. 10, the FPC 144 is also connected to a rigid circuit portion 148, with the FPC 144 and the rigid circuit portion 148 combining to form a compensation circuitry assembly 150. The IDCs 142 are inserted into the rigid circuit portion 148 of the compensation circuitry assembly 150.

FIG. 11 is an exploded view of the communication jack 100. FIG. 12 is an exploded view of a portion of the communication jack 100 showing the plug interface contacts 146, the compensation circuitry assembly 150, and the IDCs 142. As shown in FIG. 12, the plug interface contacts 146 may be assembled in a plug interface contact assembly 152, with lower ends 154 of the plug interface contacts 146 inserted into a lower plug interface contact mount 156. Curved portions 158 of the plug interface contacts 146 are curved around curved portions 160 of an upper plug interface contact mount 162.

Figure 13:
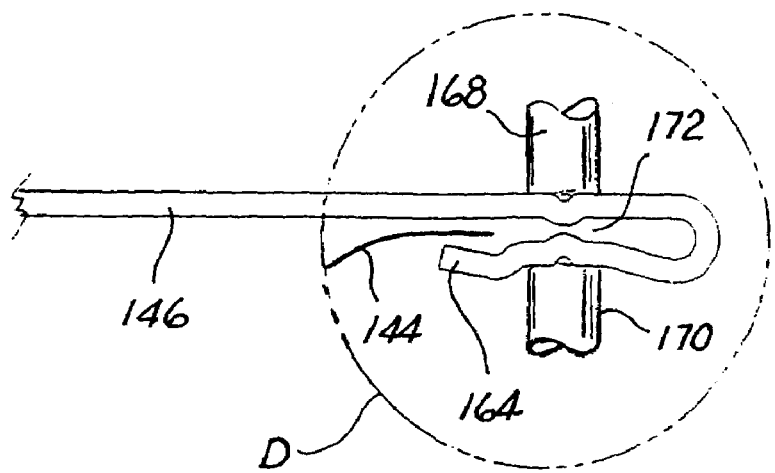
FIG. 13 is a cross-sectional view of a flexible circuit being attached to a plug interface contact.
Figure 13A:
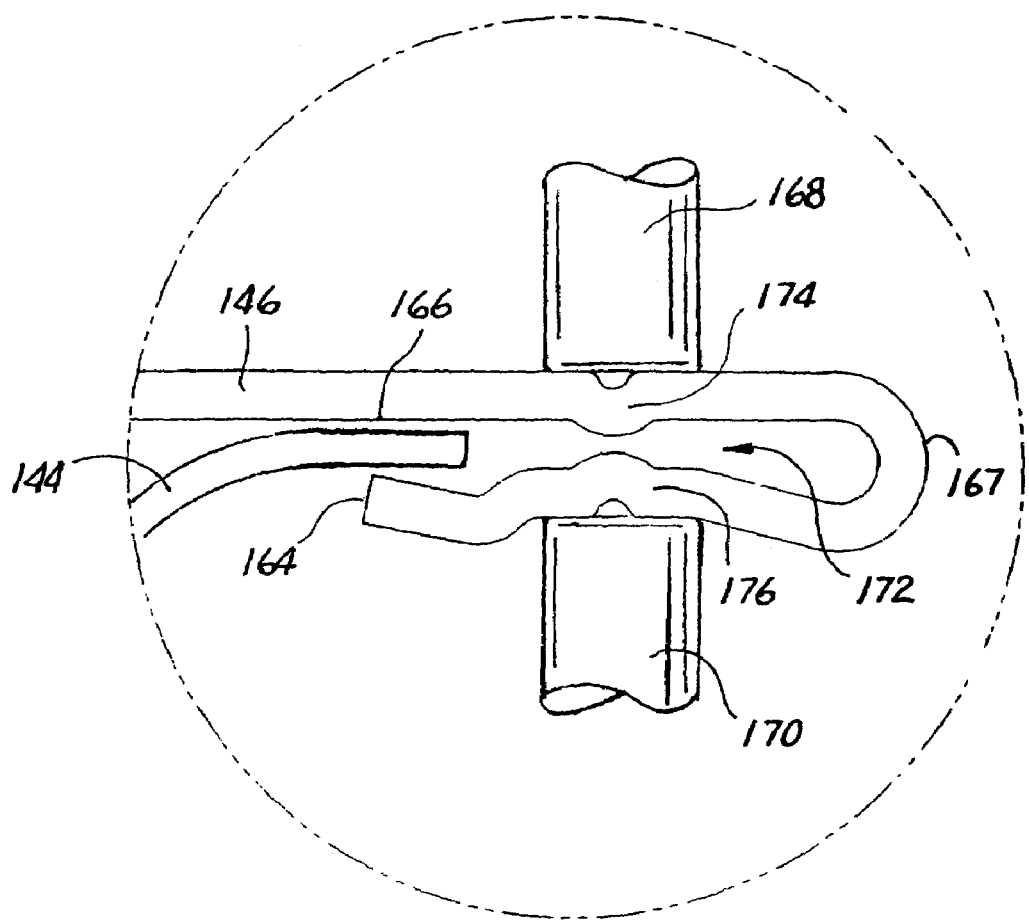
FIG. 13a is a detail view of the detail "D" of FIG. 13.

FIGS. 13-17 illustrate how the FPC 144 is attached to the plug interface contacts 146 by a welding process. FIGS. 13-17 illustrate connection to a single plug interface contact 146, but the FPC 144 is preferably attached to multiple plug interface contacts 146 simultaneously. As shown in FIGS. 13 and 13a, the FPC 144 is inserted between a mounting end 164 of the plug interface contact 146 and an opposing connecting surface 166 of the plug interface contact 146. The mounting end 164 is positioned opposite the opposing connecting surface 166 by the formation of a bend 167 in the plug interface contact. Upper and lower welder electrodes 168 and 170 are positioned above and below a welding region 172 of the plug interface contact 146. The welding region 172 may include upper and lower weld concentrator pivots 174 and 176 formed in the plug interface contact 146.

Figure 14:
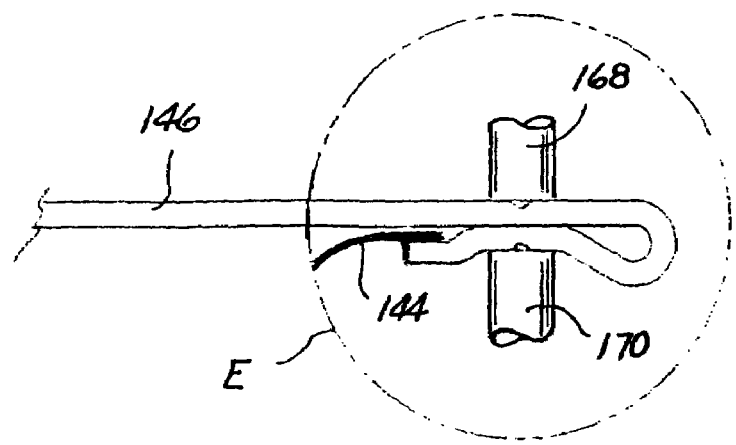
FIG. 14 is a cross-sectional view of a flexible circuit attached to a plug interface contact.
Figure 14A:
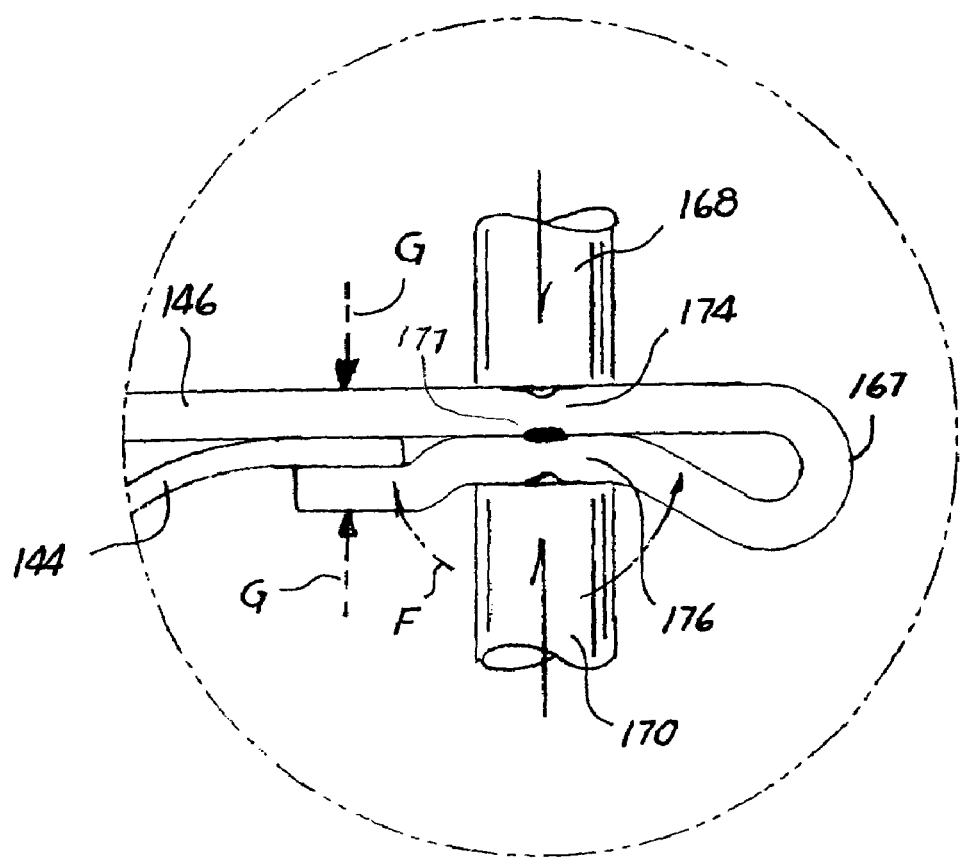
FIG. 14a is a detail view of the detail "E" of FIG. 14.

Next, as shown in FIGS. 14 and 14a, force at the outer edge of the electrodes 168 and 170 causes the mounting end 164 of the plug interface contact to rotate inwardly around the weld concentrator pivots 174 and 176 towards the FPC 144 as shown by the arrow "F." This causes a high spring force, indicated by the arrows "G," which electrically connects the FPC 144 to the plug interface contact 146 and clamps the FPC 144, retaining the FPC 144 in connection with the plug interface contact 146. A weld 177 holds the upper and lower weld concentrator pivots 174 and 176 together.

Figure 15:
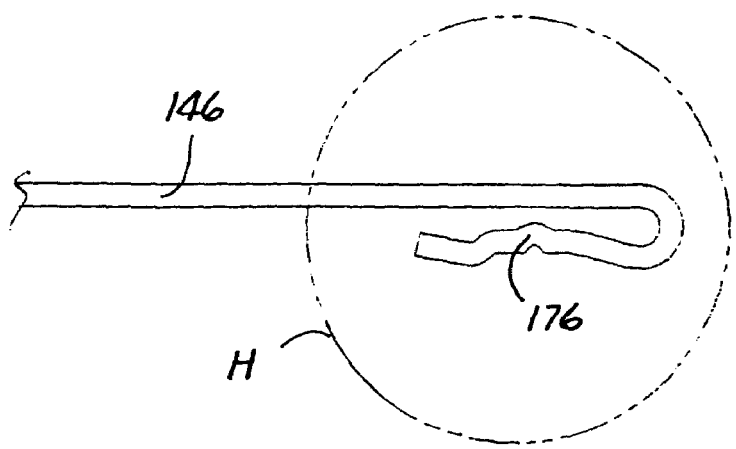
FIG. 15 is a cross-sectional view of an alternative embodiment of a plug interface contact.
Figure 15A:
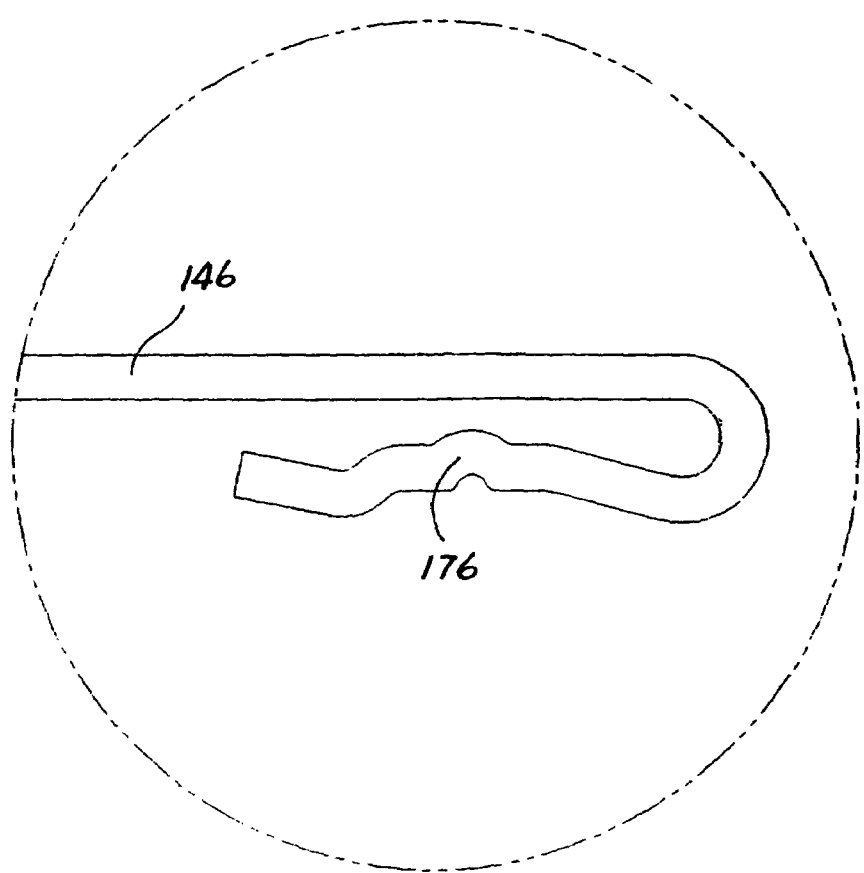
FIG. 15a is a detail view of the detail "H" of FIG. 15.

FIGS. 15 and 15a show an alternative embodiment of a plug interface contact 146 having only a lower weld concentrator pivot 176 with no upper weld concentrator pivot.

Figure 15B:
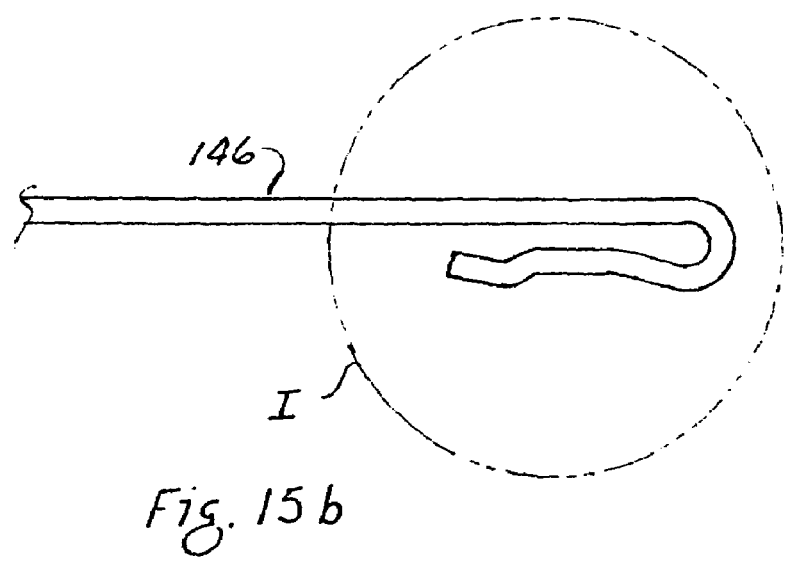
FIG. 15b is a cross-sectional view of an alternative embodiment of a plug interface contact.
Figure 15C:
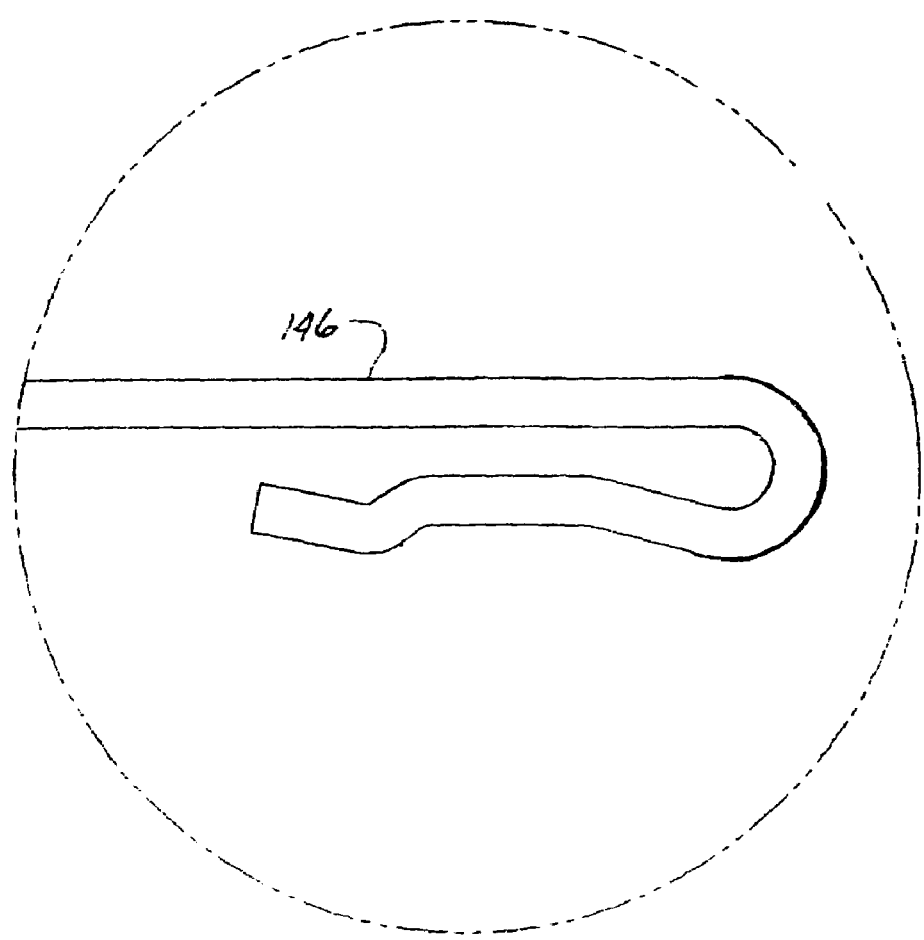
FIG. 15c is a detail view of the detail "I" of FIG. 15b.

FIGS. 15b and 15c show another alternative embodiment of a plug interface contact 146 that is formed without any concentrator pivots.

Figure 16:
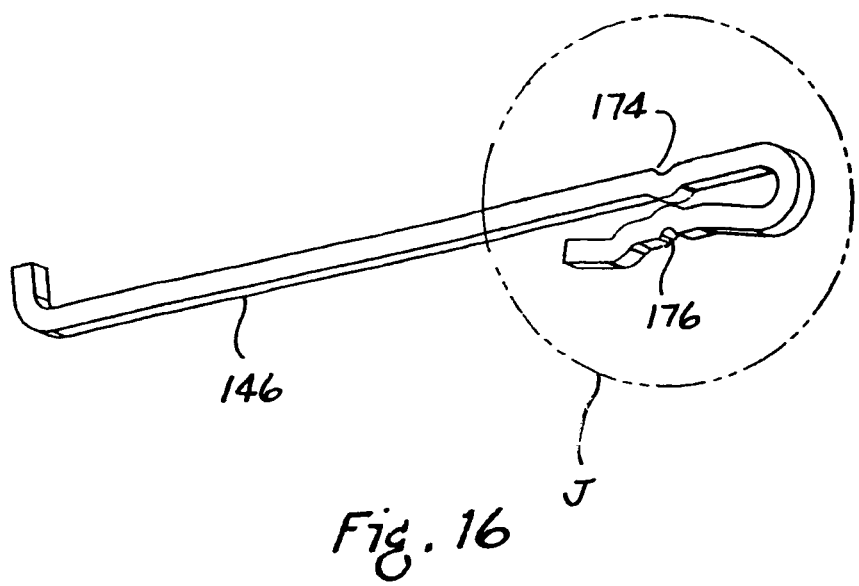
FIG. 16 is a perspective view of a plug interface contact according to one embodiment of the present invention.
Figure 17:
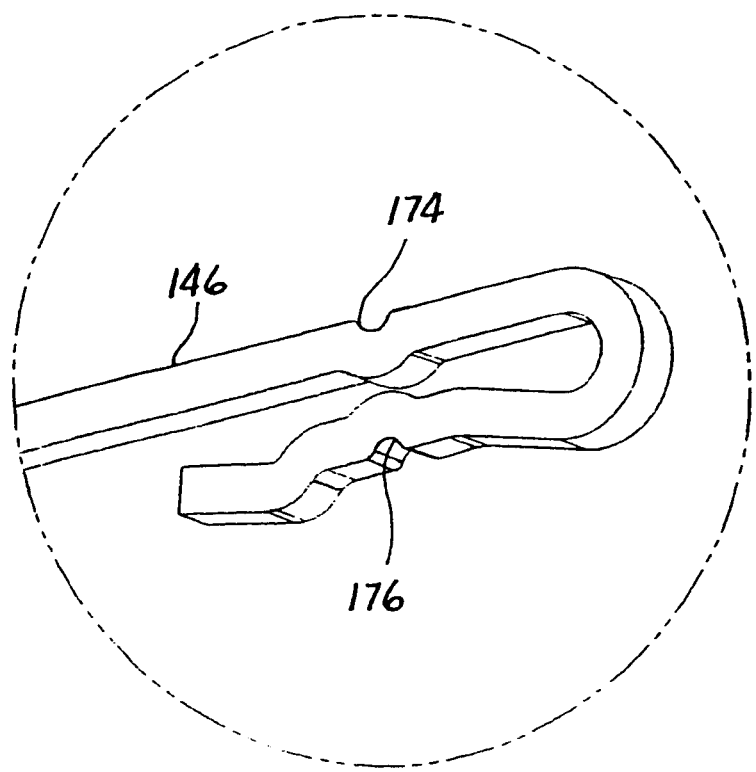
FIG. 17 is a detail view of the detail "J" of FIG. 16.

FIGS. 16 and 17 are perspective views of a plug interface contact 146 showing the locations of the upper and lower weld concentrator pivots 174 and 176.

Figure 18:
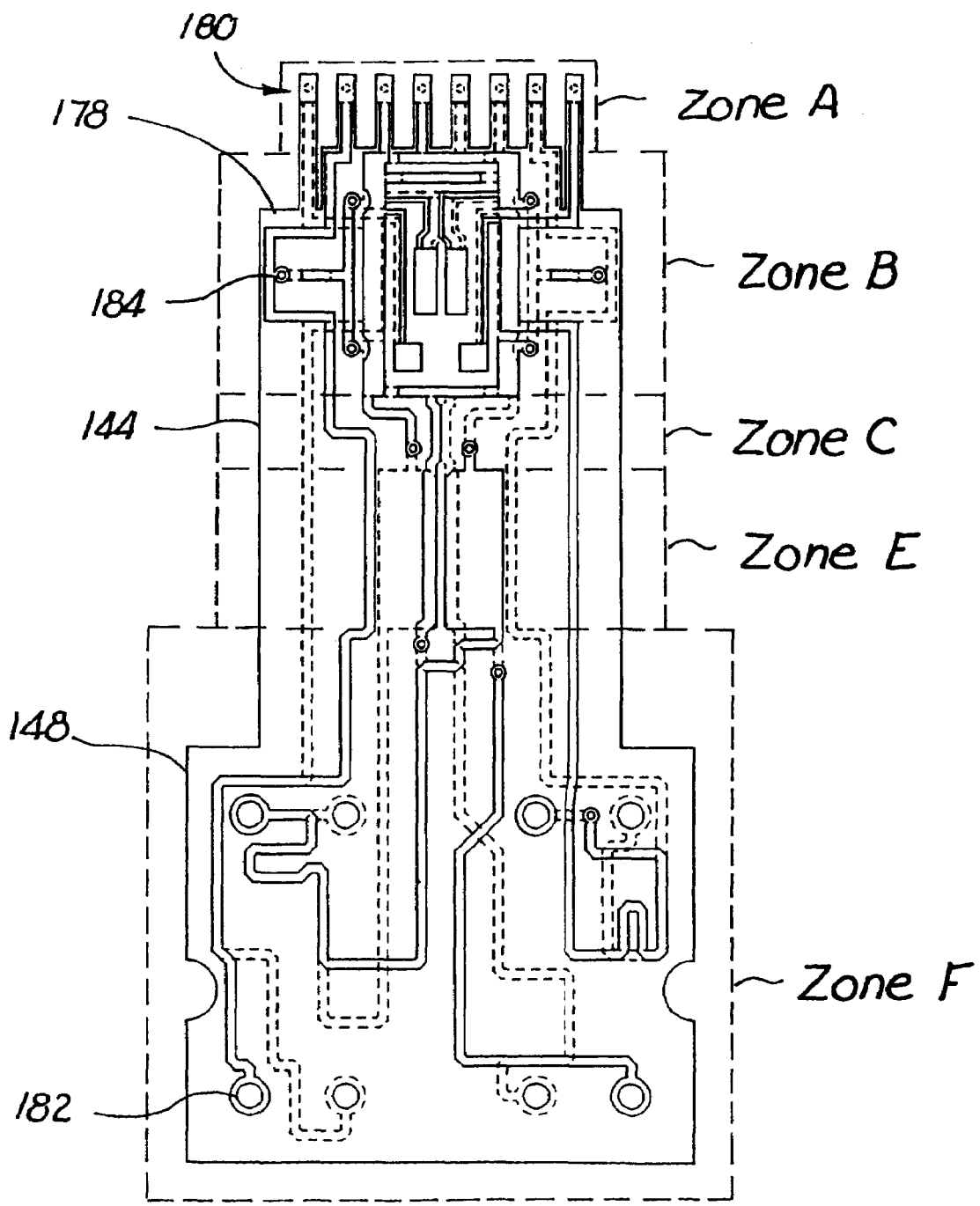
FIG. 18 is a plan view of compensation circuitry according to one embodiment of the present invention.

Turning now to FIG. 18, a trace diagram of conductive traces 178 on the FPC 144 and the rigid circuit portion 148 of the compensation circuitry assembly 150 is shown. The conductive traces consist of two layers: an upper layer that is shown by solid lines in FIG. 18 and a lower level that is shown in dotted lines. Zones A-F and Z are shown in FIGS. 18-18v. These zones generally act as follows: Zone A is a transition zone from the connection to the plug interface contacts to the NEXT (Near-End CrossTalk) compensation zone; Zone B is the NEXT compensation zone; Zone C is a transition zone from the NEXT compensation zone to the NEXT crosstalk zone; Zone D is a compensation zone to compensate for the plug interface contacts; Zone E is the NEXT crosstalk zone; Zone F is a neutral zone that connects the NEXT crosstalk zone to sockets for the IDCs; and Zone Z is an impedance compensation zone that ensures that the combined impedance of the communication jack and plug matches the impedance of other network elements.

The conductive traces 178 illustrated in FIGS. 18-18v extend from plug interface contact points 180 that contact the plug interface contacts 146 to IDC sockets 182 into which IDCs 142 are inserted. The traces may pass between the upper and lower layers through vias 184. FIG. 18 illustrates the locations of zones according to one embodiment, and FIGS. 18a through 18v illustrate conductive traces within individual zones. Numbers one through eight shown in FIGS. 18a-18u correspond to the first through eighth conductors in a four-pair embodiment.

FIG. 18a shows traces in Zone A. FIG. 18b shows the conductive traces that are on the top layer in Zone A and FIG. 18c shows the conductive traces that are on the bottom layer in Zone A.

FIG. 18d shows traces in Zone B. FIG. 18e shows the conductive traces that are on the top layer in Zone B and FIG. 18f shows the conductive traces that are on the bottom layer in Zone B.

Figure 18G:
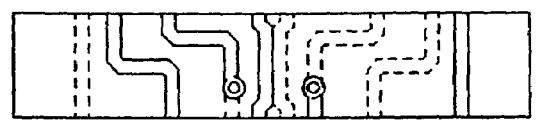
FIGS. 18a-18v are detail views of compensation zones of the compensation circuitry of FIG. 18.
Figure 18H:
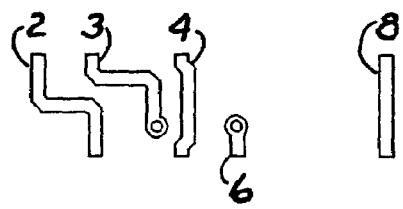
Figure 18I:
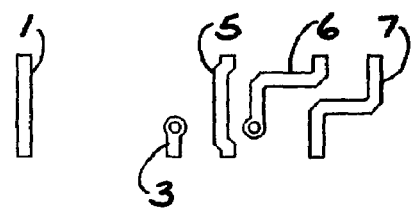

FIG. 18g shows traces in Zone C. FIG. 18h shows the conductive traces that are on the top layer in Zone C and FIG. 18i shows the conductive traces that are on the bottom layer in Zone C.

Figure 18J:
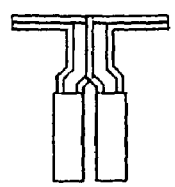
Figure 18K:
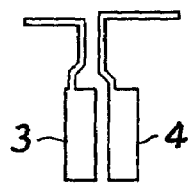
Figure 18L:
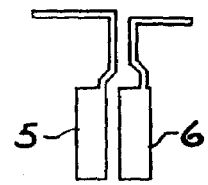

FIG. 18j shows traces in Zone D corresponding to conductors 3, 4, 5, and 6. Zone D is positioned in the middle part of Zone B in the plan view of FIG. 18. FIG. 18k shows the conductive traces corresponding to these conductors that are on the top layer in Zone D and FIG. 18l shows the conductive traces corresponding to these conductors that are on the bottom layer in Zone D.

Figure 18M:
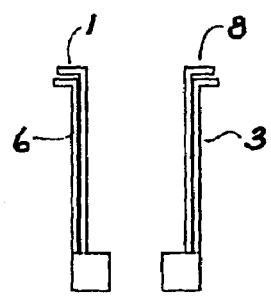
Figure 18N:
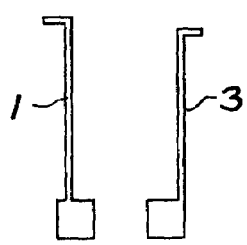
Figure 18O:
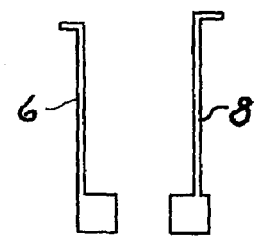

FIG. 18m shows traces in Zone D corresponding to conductors 1, 3, 6, and 8. FIG. 18n shows the conductive traces corresponding to these conductors that are on the top layer in Zone D and FIG. 18o shows the conductive traces corresponding to these conductors that are on the bottom layer in Zone D.

Figure 18P:
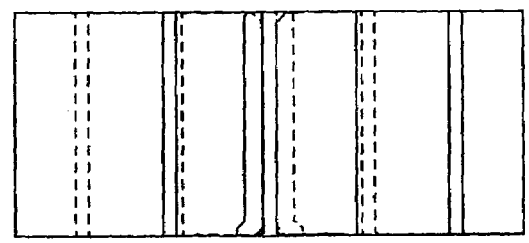
Figure 18Q:
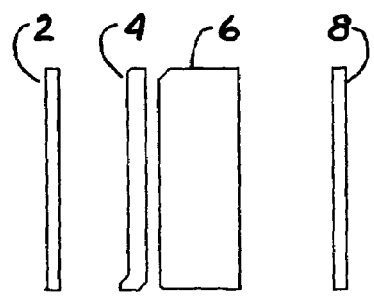
Figure 18R:
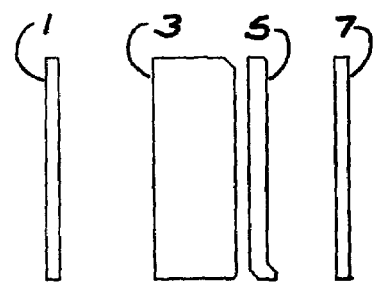

FIG. 18p shows traces in Zone E. FIG. 18q shows the conductive traces that are on the top layer in Zone E and FIG. 18r shows the conductive traces that are on the bottom layer in Zone E.

Figure 18S:
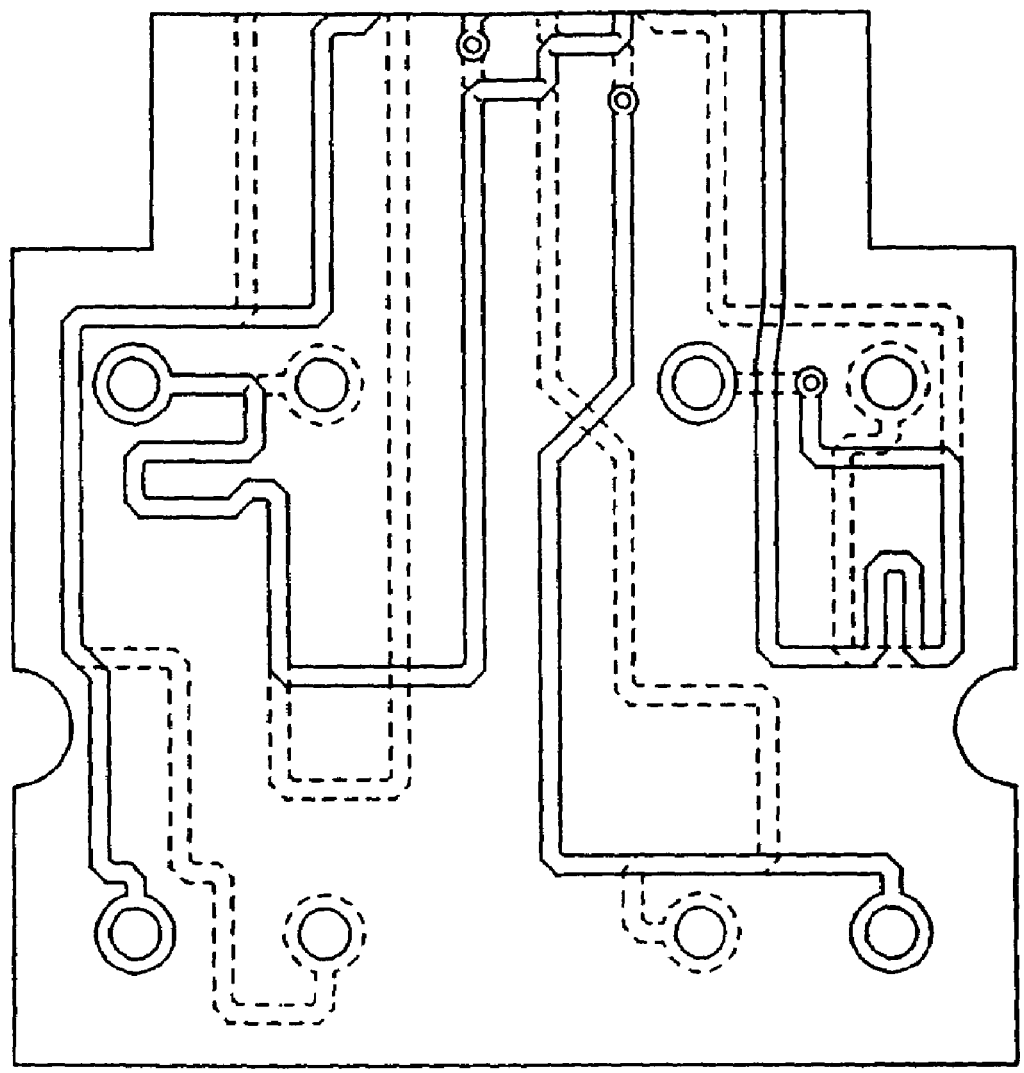
Figure 18T:
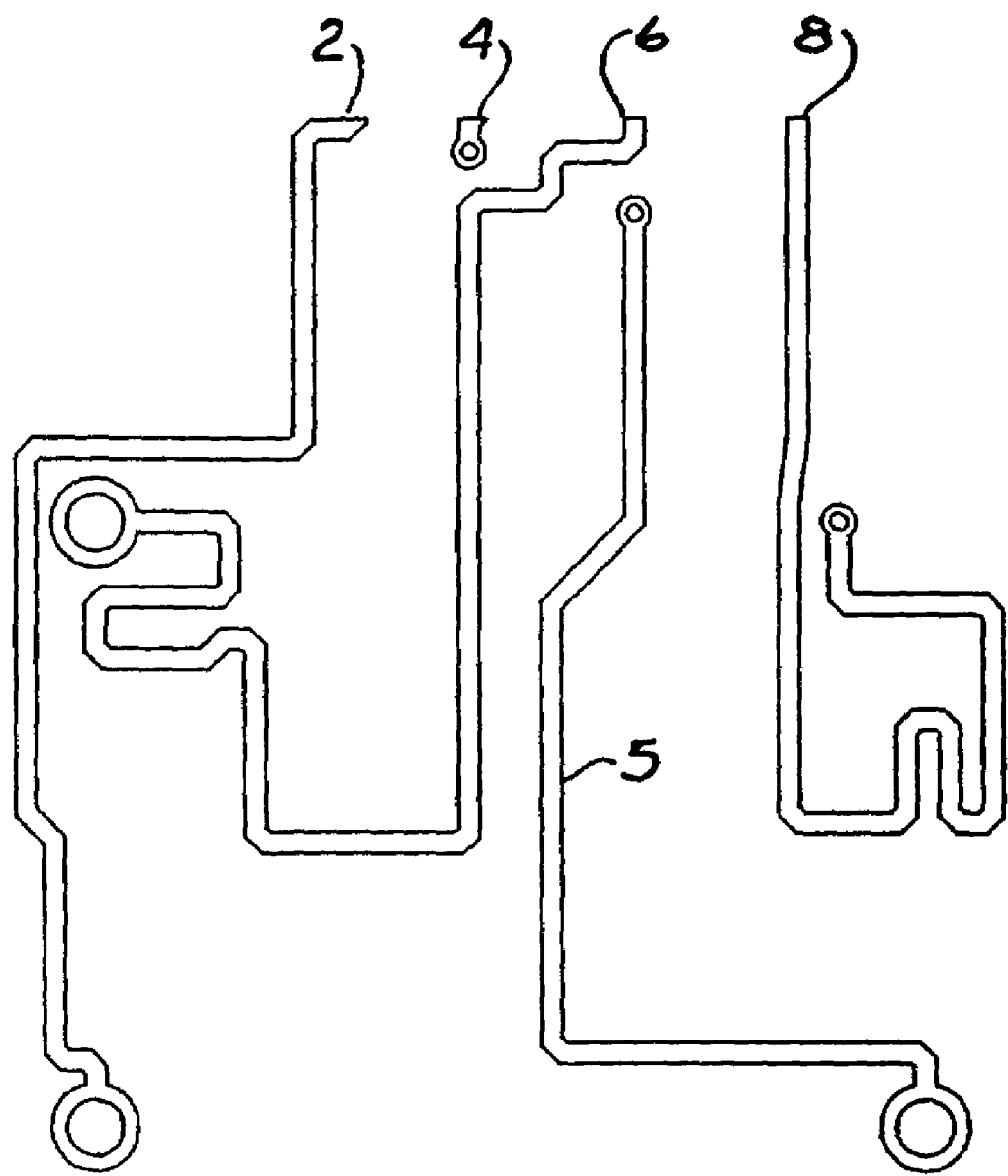
Figure 18U:
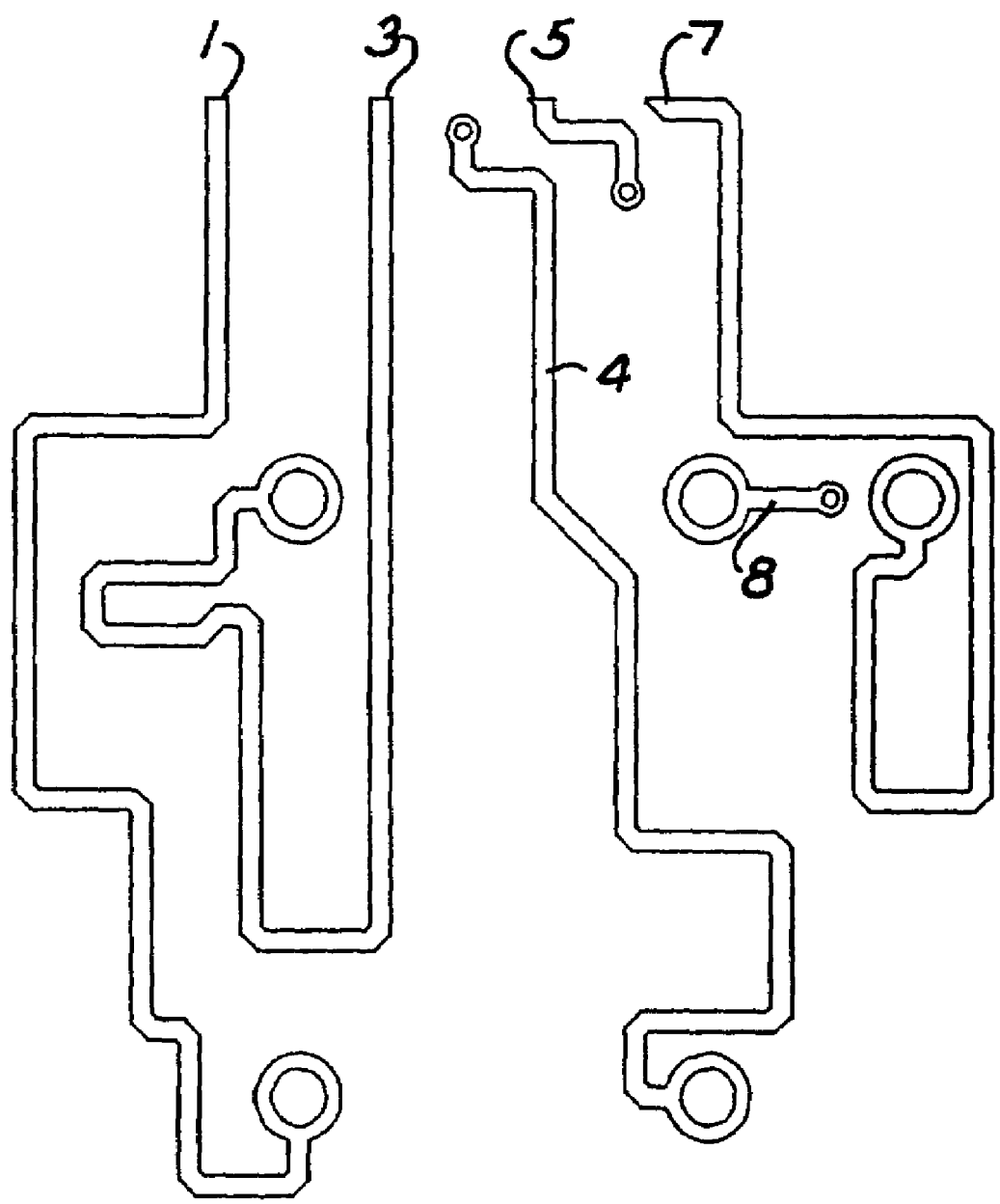

FIG. 18s shows traces in Zone F. FIG. 18t shows the conductive traces that are on the top layer in Zone F and FIG. 18u shows the conductive traces that are on the bottom layer in Zone F.

FIG. 18v shows the conductive traces that are in Zone Z. Zone Z is located above Zone D in the plan view of FIG. 18.

Figure 19:
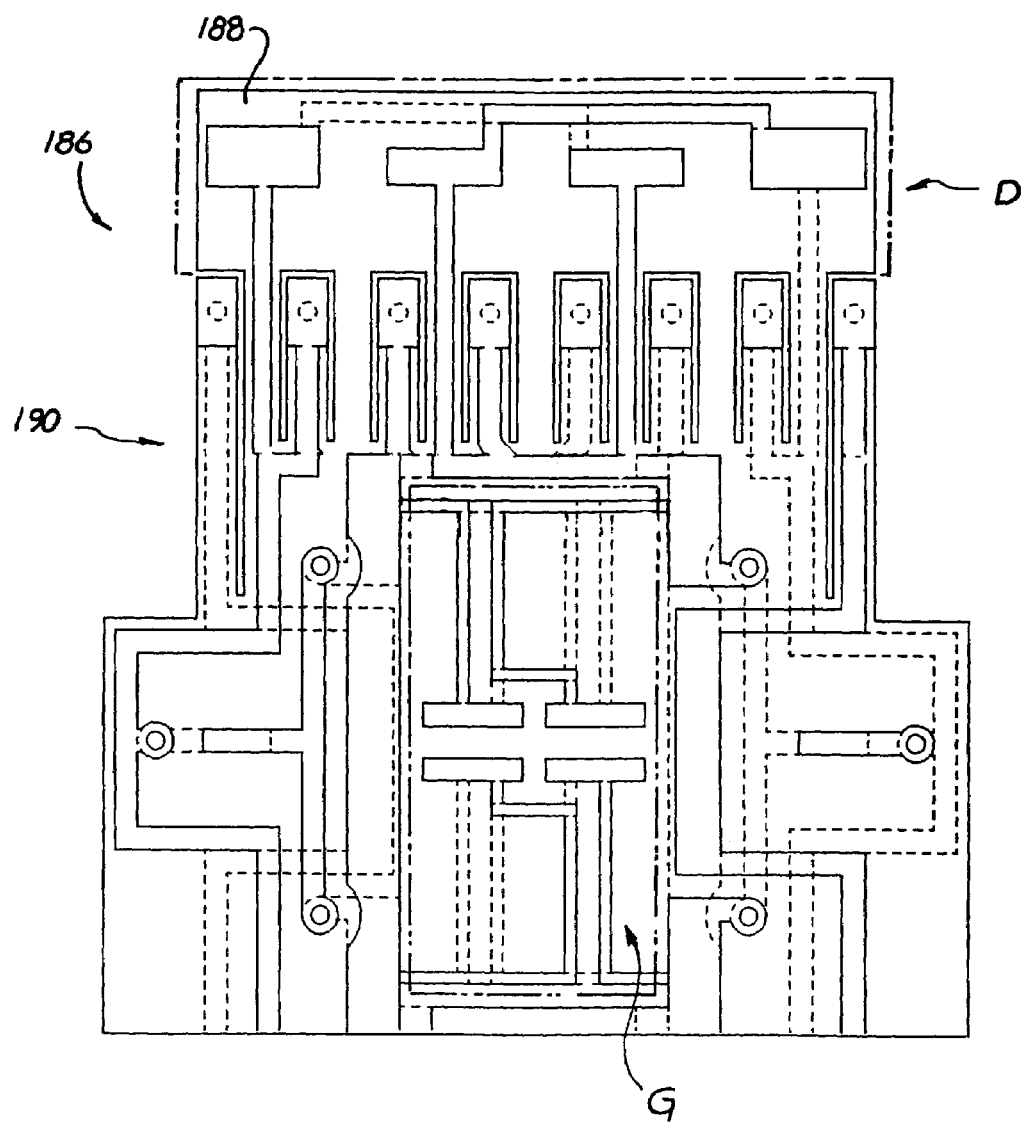
FIG. 19 is a plan view of compensation circuitry according to another embodiment of the present invention.

FIG. 19 shows a portion of a flexible circuit board 186 according to another embodiment of the present invention. The flexible circuit board 186 has Zone D provided on a fold-over portion 188, such that the fold-over portion 188 can be folded around a folding pivot 190. The flexible circuit board 186 also includes a "Zone G" compensation section. Zone G is a zone in which compensation changes as frequency increases. Such compensation is further shown and described in U.S. patent application Ser. No. 11/099,110, Publication No. 2005/0277339, which is incorporated herein by reference in its entirety.

Figure 19A:
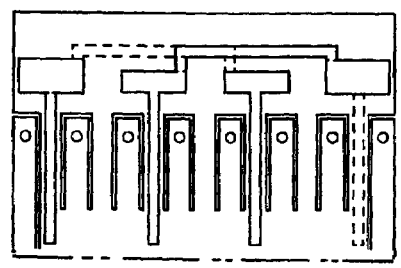
FIGS. 19a-19f are detail views of compensation zones of the compensation circuitry of FIG. 19.
Figure 19B:
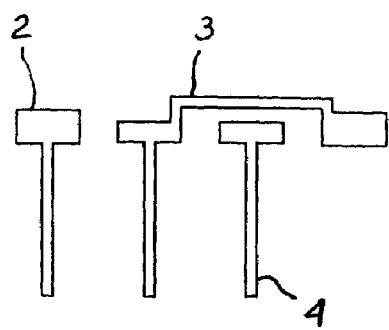
Figure 19C:
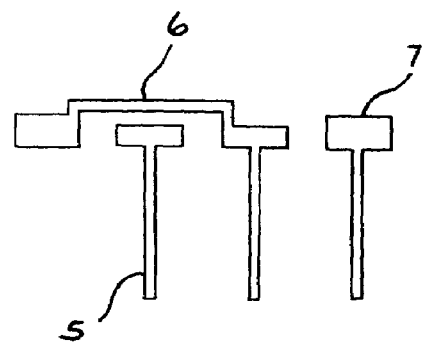

FIG. 19a shows conductive traces in Zone D of the embodiment of FIG. 19. FIG. 19b shows the conductive traces that are on the top layer in Zone D and FIG. 19c shows the conductive traces that are on the bottom layer in Zone D.

Figure 19D:
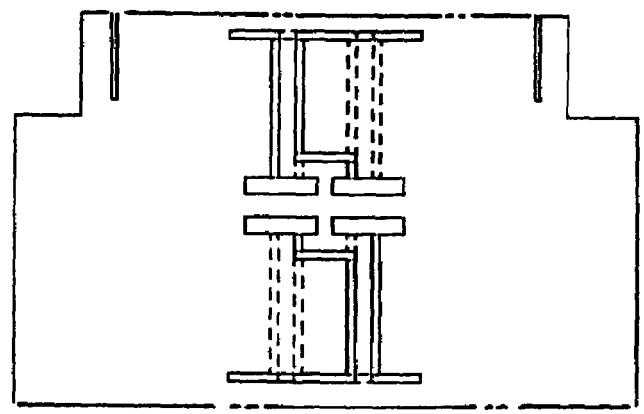
Figure 19E:
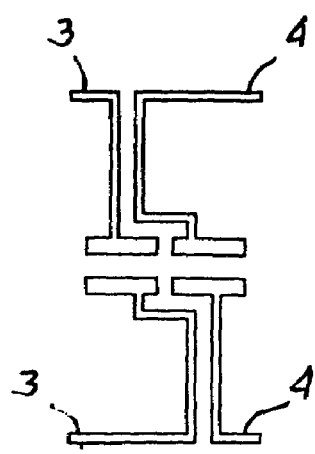
Figure 19F:
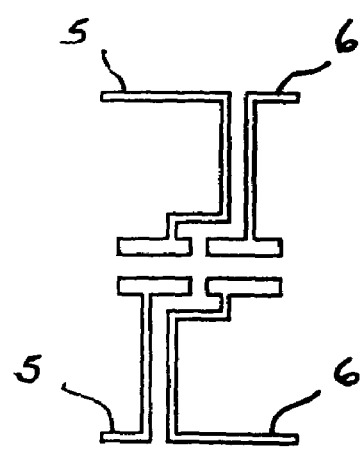

FIG. 19d shows conductive traces in Zone G of the embodiment of FIG. 19. FIG. 19e shows the conductive traces that are on the top layer in Zone G and FIG. 19f shows the conductive traces that are on the bottom layer in Zone G.

Figure 19G:
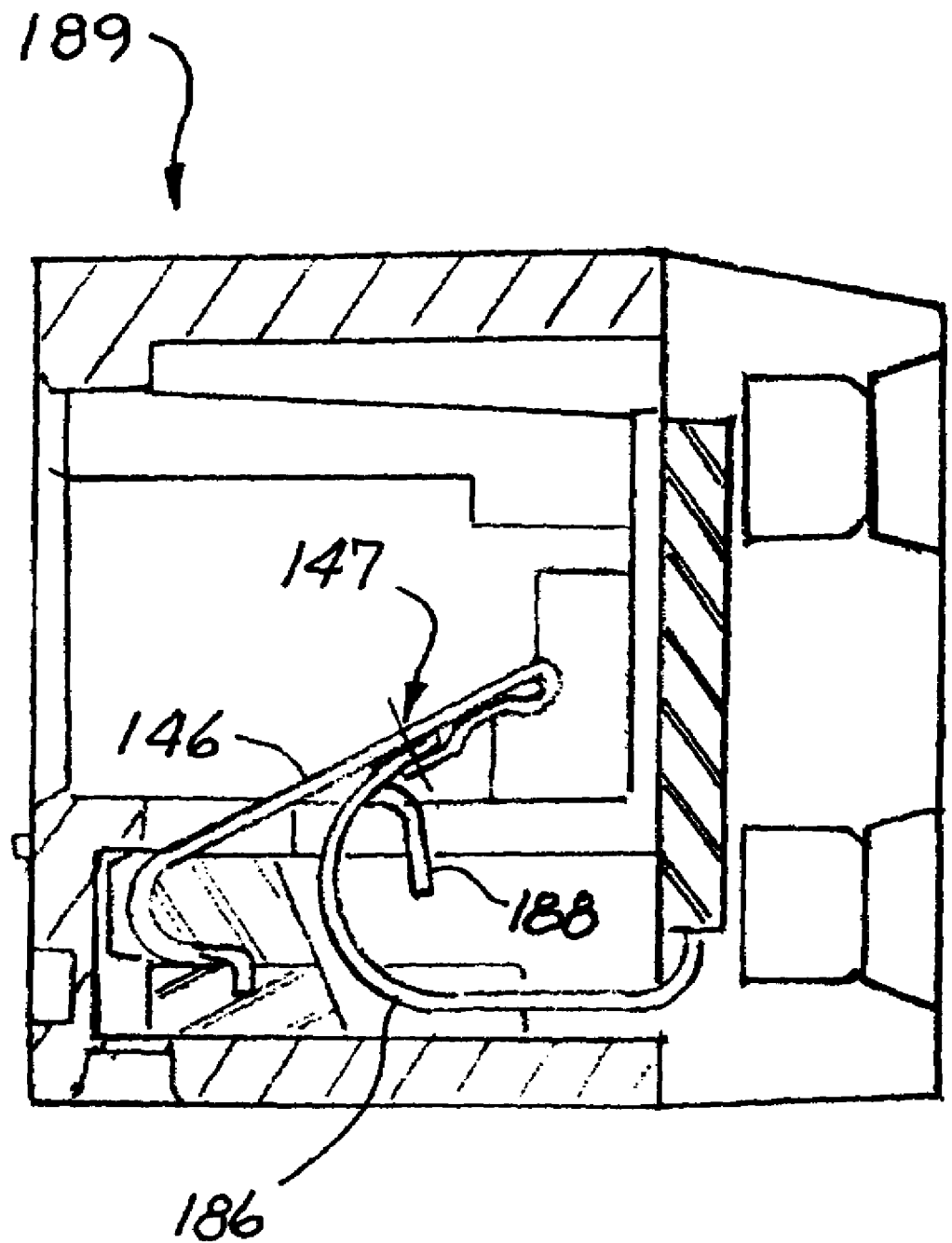
FIG. 19g is a cross-sectional view of a communication jack with the compensation circuitry of FIG. 19 installed therein.

FIG. 19g is a cross-sectional view of part of a communication jack 189 with the flexible circuit board 186 installed. The flexible circuit board 186 makes electrical contact with the plug interface contacts 146 directly below the plug-jack interface 147. The fold-over portion 188 is shown in its folded configuration.

It is beneficial to include far-end crosstalk (FEXT) compensation in some embodiments of communication jacks. The location of distributed capacitive and/or inductive crosstalk or compensation does not affect FEXT, because signals generated by distributed couplings all arrive at the extremity of the connector at the same time. However, when negative-polarity capacitive (−C) and positive-polarity inductive (+L) compensation is added in a FEXT zone, ideally it is distributed, and the capacitive and inductive compensation disposed in the same location to make their effect on NEXT=0.

FEXT compensation may be used in connectors with balanced NEXT but net capacitive coupling greater than net inductive coupling.

The procedure to determine the magnitude of −C and +L in a FEXT compensation zone is as follows:

$FEXT = C_T - L_T$
- $C_T$ = Total net capacitance of connector including the FEXT zone
- $L_T$ = Total net inductance of connector including the FEXT zone
- $C_F$ = Capacitance of FEXT compensation zone
- $L_F$ = Inductance of FEXT compensation zone
- $C_T = C_R + C_F$
- $L_T = L_R + L_F$
- $C_R$ = Total net capacitance of connector without the FEXT zone
- $L_R$ = Total net inductance of connector without the FEXT zone.

$C_F$ and $L_F$ are designed to be equal in magnitude and their magnitude is designed to make $C_T$ equal to $L_T$ and therefore FEXT=0.

Figure 20:
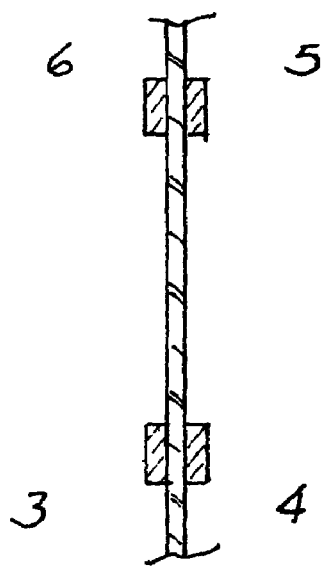
FIG. 20 is a cross-sectional view of circuit traces for a FEXT compensation zone.
Figure 20A:
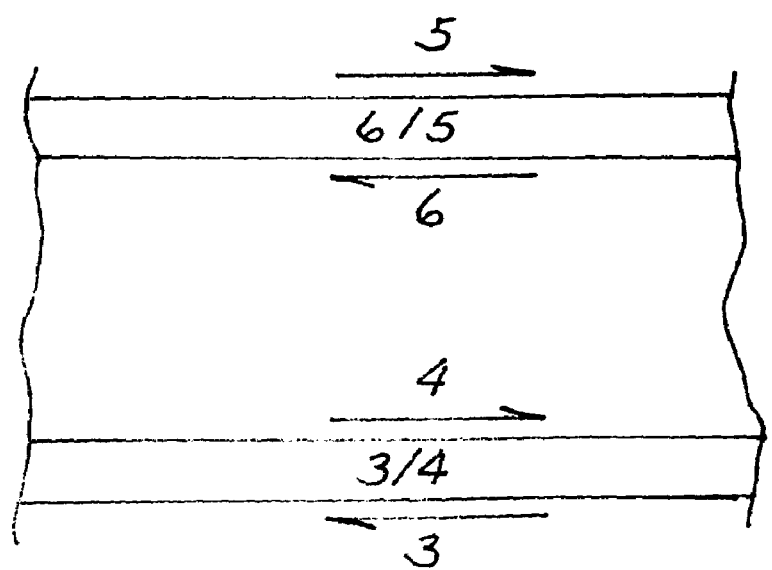
FIG. 20a illustrates adjacent circuit traces according to one embodiment of a FEXT compensation zone.

FIGS. 20 and 20a show examples of conductive traces for conductors 3, 4, 5, and 6 of a connector in which a distributed FEXT zone is used to result in substantially no FEXT. As shown in FIG. 20, a fifth conductive trace overlies a sixth conductive trace and a fourth conductive trace overlies a third conductive trace. As shown in FIG. 20a, the lengths of the traces are chosen as required to result in zero FEXT for the connector. The arrows in FIG. 20a show the direction of signal current through the conductive traces.

Figure 21:
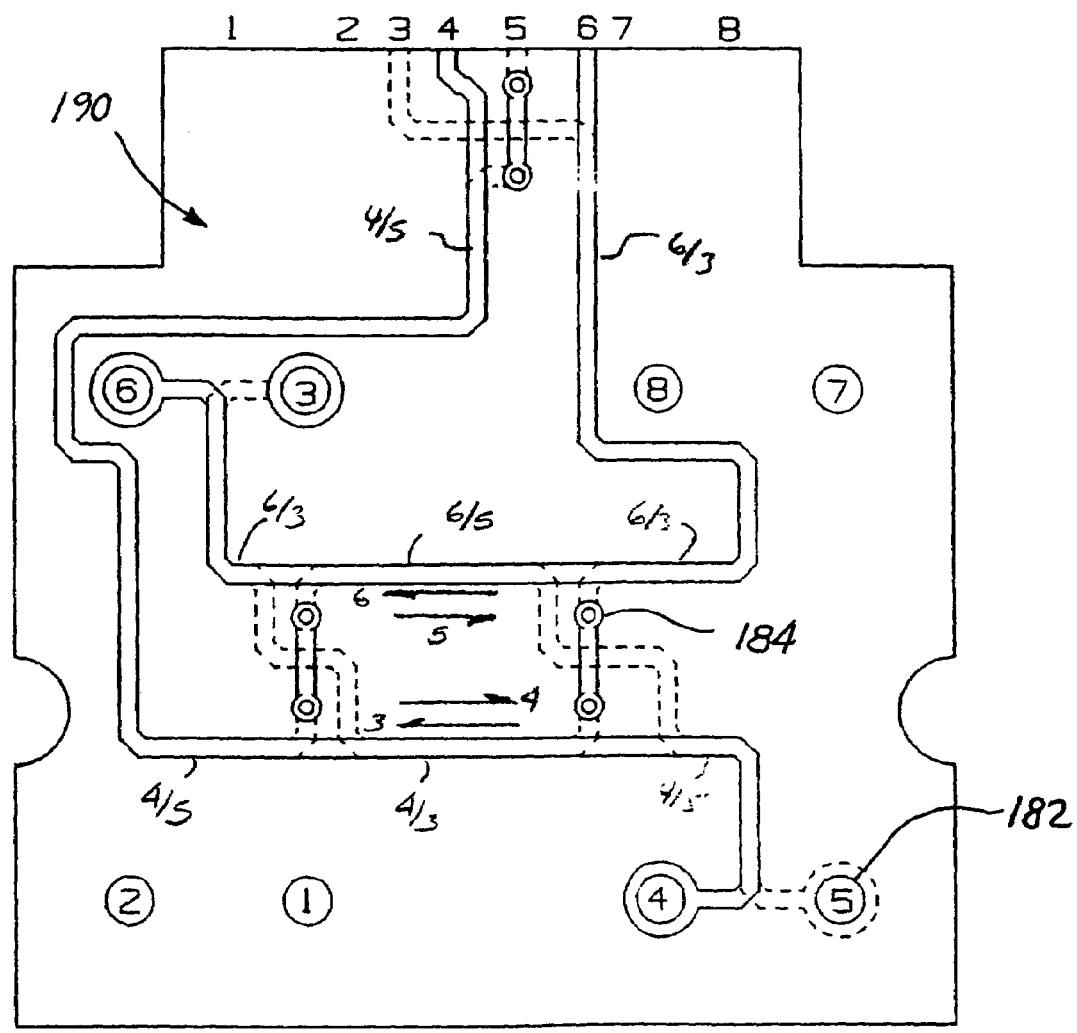
FIG. 21 is a plan view of a circuitry zone employing FEXT compensation.

FIG. 21 shows conductive traces in one embodiment of a circuit board in which FEXT compensation is incorporated into Zone F. Solid lines in FIG. 21 indicate traces on an upper layer and dotted lines represent traces on a lower layer. In sections where the traces on the upper and lower layers overlap, number designations are used to show the overlapping traces. For example, in a section labeled "6/3," a conductive trace corresponding to the sixth conductor is overlapping a conductive trace corresponding to the third conductor. IDC sockets 182 and vias 184 are also illustrated in FIG. 21.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A jack comprising:
   plug interface contacts configured to connect with plug contacts of a plug inserted into the jack; and
   a flexible printed circuit (FPC) mechanically and electrically connected to the plug interface contacts, the FPC having a compensation circuit configured to compensate for near-end crosstalk (NEXT) and far-end crosstalk (FEXT), the compensation circuit having inductive and capacitive compensation configured such that the capacitive and inductive compensation are of opposite polarity and substantially equal in magnitude, the compensation circuit having a FEXT compensation zone containing compensation for the FEXT, inductive and capacitive compensation in the FEXT compensation zone being distributed, wherein the FEXT compensation zone comprises first, second, third, and fourth traces, the first and second traces being associated with a first differential circuit pair of the jack and the third and fourth circuit traces being associated with a second differential circuit pair of the jack wherein a portion of the second trace overlies a portion of the fourth trace and a portion of the first trace overlies a portion of the third trace;
   wherein the compensation circuit further comprises:
   an impedance compensation zone configured to ensure that a combined impedance of the communication jack and plug matches an impedance of other network elements, the impedance compensation zone disposed above the plug interface contact compensation zone;
   first and second transition zones, the first transition zone adjacent to a connection to the plug interface contacts;
   a NEXT compensation zone between the first and second transition zones;
   a neutral zone;
   a NEXT crosstalk zone between the second transition zone and the neutral zone;
   a plug interface contact compensation zone configured to compensate for the plug interface contacts, the plug interface contact zone being electrically connected to the compensation circuit at a juncture between the first transition zone and the NEXT compensation zone;
   and wherein the FPC comprises:
   a folding pivot, the folding pivot located at the juncture between the first transition zone and the NEXT compensation zone; and
   a fold-over portion foldable wound the folding pivot, the plug interface contact compensation zone being located on the fold-over portion.

2. The jack of claim 1, wherein substantially all of the compensation in the jack for FEXT occurs in the FEXT compensation zone.

3. The jack of claim 1, further comprising:
   a rigid circuit portion to which the FPC is attached; and
   insulation displacement contacts (IDCs),
   the neutral zone and the rigid circuit portion containing sockets into which the IDCs are inserted, the FPC and rigid circuit portion attached at least by the IDCs, the neutral zone disposed at one end of the FPC.

4. The jack of claim 1, wherein the FEXT compensation zone is disposed in the neutral zone.

5. The jack of claim 1, wherein the compensation circuit further comprises
   a symmetrical frequency dependent compensation zone having a compensation that varies with frequency.

6. The jack of claim 1, wherein:
   a first end of the FPC is clamped in a clamping area between a mounting end and an intermediate portion of at least one of the plug interface contacts, and
   the at least one of the plug interface contacts comprises:
   a bend disposed laterally between the mounting end and intermediate portion, and
   a weld disposed in a weld region between the clamping area and the bend.

7. The jack of claim 6, wherein the at least one of the plug interface contacts comprises at least one weld concentrator pivot, the weld connecting the at least one weld concentrator pivot to an opposite side of the at least one of the plug interface contacts.

8. The jack of claim 6, wherein the mounting end is rotated inwardly in the clamping area to clamp the FPC.

9. The jack of claim 1, further comprising:
a front jack housing and a rear jack housing, the rear jack housing having a mounting hole and fin restraints;
a conductive pair divider having a mounting projection inserted into the mounting hole and a lower fin engaging the fin restraints; and
a wire containment cap slidably mounted within the rear jack housing, the wire containment cap containing:
a strain relief guide slot and strain relief latch teeth to accommodate a strain relief clip,
an opening providing access to two slots having funnel-shaped entrances, each slot being large enough to hold a twisted wire pair, the slots separated by a spline,
a saddle area configured to serve as a lower support for a cable when the cable is secured by the strain relief clip, the saddle area being sufficiently low and the spine being sufficiently offset from a rear end of the wire containment cap to provide ample space to cross over twisted pairs on rear sides of the slots, and
upper and lower wire retainers having upper and lower wire restraints configured to accept individual wires.

10. A jack comprising:
plug interface contacts configured to connect with plug contacts of a plug inserted into the jack; and
a flexible printed circuit (FPC) mechanically and electrically connected to the plug interface contacts, the FPC having a compensation circuit configured to compensate for near-end crosstalk (NEXT) and far-end crosstalk (FEXT), the compensation circuit having a FEXT compensation zone containing compensation for the FEXT, inductive and capacitive compensation in the FEXT compensation zone configured such that there is no net effect of the inductive and capacitive compensation on NEXT, wherein the FEXT compensation zone comprises first, second, third, and fourth traces, the first and second traces being associated with a first differential circuit pair of the jack and the third and fourth circuit traces being associated with a second differential circuit pair of the jack wherein a portion of the second trace overlies a portion of the fourth trace and a portion of the first trace overlies a portion of the third trace;
wherein the compensation circuit further comprises;
an impedance compensation zone configured to ensure that a combined impedance of the communication jack and plug matches an impedance of other network elements, the impedance compensation zone disposed above the plug interface contact compensation zone;
first and second transition zones, the first transition zone adjacent to a connection to the plug interface contacts;
a NEXT compensation zone between the first and second transition zones;
a neutral zone;
a NEXT crosstalk zone between the second transition zone and the neutral zone;
a plug interface contact compensation zone configured to compensate for the plug interface contacts, the plug interface contact zone being electrically connected to the compensation circuit at a juncture between the first transition zone and the NEXT compensation zone;
and wherein the FPC comprises:
a folding pivot, the folding pivot located at the juncture between the first transition zone and the NEXT compensation zone; and
a fold-over portion foldable around the folding pivot, the plug interface contact compensation zone being located on the fold-over portion.

11. A method of compensating for near-end crosstalk (NEXT) and far-end crosstalk (FEXT) in a communication apparatus, the method comprising:
providing a flexible printed circuit (FPC) in a jack mechanically and electrically connected to plug interface contacts in the jack, the FPC having a compensation circuit configured to compensate for the NEXT and FEXT, the compensation circuit having:
inductive and capacitive compensation of opposite polarity and that are substantially equal in magnitude, and
a FEXT compensation zone containing compensation for the FEXT, inductive and capacitive compensation in the FEXT compensation zone being distributed, wherein the FEXT compensation zone comprises first, second, third, and fourth traces, the first and second traces being associated with a first differential circuit pair of the jack and the third and fourth circuit traces being associated with a second differential circuit pair of the jack wherein a portion of the second trace overlies a portion of the fourth trace and a portion of the first trace overlies a portion of the third trace;
wherein the compensation circuit further comprises:
an impedance compensation zone configured to ensure that a combined impedance of the communication jack and plug matches an impedance of other network elements, the impedance compensation zone disposed above the plug interface contact compensation zone;
first and second transition zones, the first transition zone adjacent to a connection to the plug interface contacts;
a NEXT compensation zone between the first and second transition zones;
a neutral zone;
a NEXT crosstalk zone between the second transition zone and the neutral zone;
a plug interface contact compensation zone configured to compensate for the plug interface contacts, the plug interface contact zone being electrically connected to the compensation circuit at a juncture between the first transition zone and the NEXT compensation zone;
and wherein the FPC comprises:
a folding pivot, the folding pivot located at the juncture between the first transition zone and the NEXT compensation zone; and
a fold-over portion foldable around the folding pivot, the plug interface contact compensation zone being located on the fold-over portion.

12. The method of claim 11, wherein the FEXT compensation zone is disposed in the neutral zone.

13. The method of claim 11, wherein the compensation circuit further comprises
a frequency dependent compensation zone having a compensation that varies with frequency.

14. The method of claim 11, further comprising:
clamping a first end of the FPC is clamped in a clamping area between a mounting end and an intermediate portion of at least one of the plug interface contacts, the at least one of the plug interface contacts comprising a bend disposed laterally between the mounting end and intermediate portion; and welding the at least one of the plug interface contacts to itself in a weld region between the clamping area and the bend.

15. The method of claim 14, the welding comprising welding at least one weld concentrator pivot to an opposite side of the at least one of the plug interface contacts.

16. The method of claim 14, wherein the clamping comprises rotating the mounting end inwardly in the clamping area.

17. The method of claim 11, wherein the FEXT compensation zone comprises adjacent first and second conductive traces, the method further comprising providing a first current through the first conductive trace from a first plug interface contact to a first cable contact and providing a second current through the second conductive trace from a second cable contact to a second plug interface contact.

* * * * *